United States Patent
Xiong et al.

(10) Patent No.: US 9,401,469 B2
(45) Date of Patent: Jul. 26, 2016

(54) THIN-FILM PIEZOELECTRIC MATERIAL ELEMENT, METHOD OF MANUFACTURING THE SAME, HEAD GIMBAL ASSEMBLY, HARD DISK DRIVE, INK JET HEAD, VARIABLE FOCUS LENS AND SENSOR

(71) Applicant: SAE Magnetics (H.K.) Ltd., Hong Kong (CN)

(72) Inventors: Wei Xiong, Hong Kong (CN); Takao Noguchi, Hong Kong (CN); Daisuke Iitsuka, Hong Kong (CN)

(73) Assignee: SAE MAGNETICS (H.K.) LTD., Hong Kong (CN)

( * ) Notice: Subject to any disclaimer, the term of this patent is extended or adjusted under 35 U.S.C. 154(b) by 3 days.

(21) Appl. No.: 14/591,114

(22) Filed: Jan. 7, 2015

(65) Prior Publication Data

US 2016/0093792 A1 Mar. 31, 2016

(30) Foreign Application Priority Data

Sep. 29, 2014 (JP) .................................. 2014-198676
Nov. 27, 2014 (JP) .................................. 2014-239589

(51) Int. Cl.

| | |
|---|---|
| *G11B 5/55* | (2006.01) |
| *H01L 41/083* | (2006.01) |
| *H01L 41/053* | (2006.01) |
| *H01L 41/08* | (2006.01) |

(Continued)

(52) U.S. Cl.
CPC ............... *H01L 41/0536* (2013.01); *B41J 2/14* (2013.01); *B41J 2/14233* (2013.01); *G02B 3/14* (2013.01); *G02B 7/04* (2013.01); *G11B 5/483* (2015.09); *G11B 5/5552* (2013.01); *H01L 41/0805* (2013.01); *H01L 41/0815* (2013.01); *H01L 41/0831* (2013.01); *H01L 41/1132* (2013.01)

(58) Field of Classification Search
CPC ....... G11B 5/483; H01L 41/0831; B41J 2/14; B41J 2/14201; G02B 7/04
USPC ...................................... 360/294.4
See application file for complete search history.

(56) References Cited

U.S. PATENT DOCUMENTS

| | | | |
|---|---|---|---|
| 2010/0148637 A1* | 6/2010 | Satou ...................... | H03H 3/02 310/367 |
| 2011/0204750 A1* | 8/2011 | Fujii ...................... | H01L 41/094 310/330 |

(Continued)

FOREIGN PATENT DOCUMENTS

| | | |
|---|---|---|
| JP | 11-087791 | 3/1999 |
| JP | 2003-101095 | 4/2003 |

(Continued)

*Primary Examiner* — Jefferson Evans
(74) *Attorney, Agent, or Firm* — Nixon & Vanderhye PC

(57) ABSTRACT

A thin-film piezoelectric material element includes a lower electrode film, a piezoelectric material film, and an upper electrode film, the lower electrode film, the piezoelectric material film and the upper electrode film are laminated sequentially. An upper surface of the piezoelectric material film is a concavity and convexity surface having a convex part and a concave part, the convex part is a curved surface convexly projected, and the concave part is a curved surface concavely hollowed, the upper electrode film is formed on the concavity and convexity surface. The thin-film piezoelectric material element has a stress balancing film formed with a material having an internal stress capable of cancelling an element stress, the stress balancing film is formed on the upper electrode film.

20 Claims, 30 Drawing Sheets

(51) Int. Cl.
 *B41J 2/14* (2006.01)
 *H01L 41/113* (2006.01)
 *G02B 3/14* (2006.01)
 *G02B 7/04* (2006.01)

(56) References Cited

U.S. PATENT DOCUMENTS

2015/0207057 A1* 7/2015 Sakuma ............... B41J 2/14201
 360/294.4
2015/0333728 A1* 11/2015 Iwakawa ................. H03H 9/17
 310/353
2016/0087192 A1* 3/2016 Doi ..................... H01L 41/1876
 428/64.1
2016/0099705 A1* 4/2016 Matsuda ................ H03H 9/171
 310/321

FOREIGN PATENT DOCUMENTS

| | | | | |
|---|---|---|---|---|
| JP | 2007-36612 A | * | 2/2007 | ............. H04R 17/00 |
| JP | 2010-103194 | | 5/2010 | |
| JP | 2012-076387 | | 4/2012 | |
| JP | 2012-94613 A | * | 5/2012 | ............. H01L 41/08 |

* cited by examiner

Fig.10
(A)
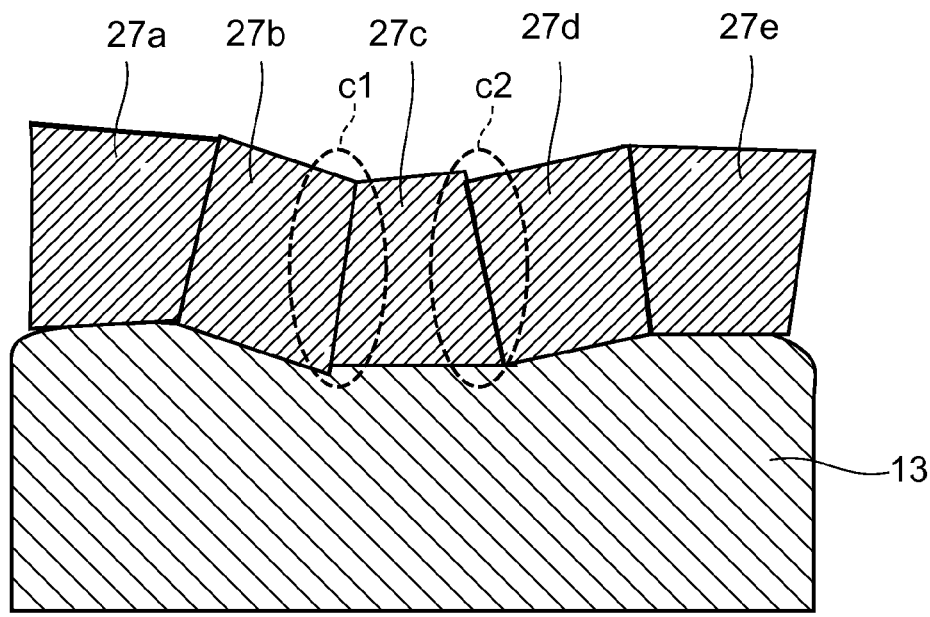
(B)
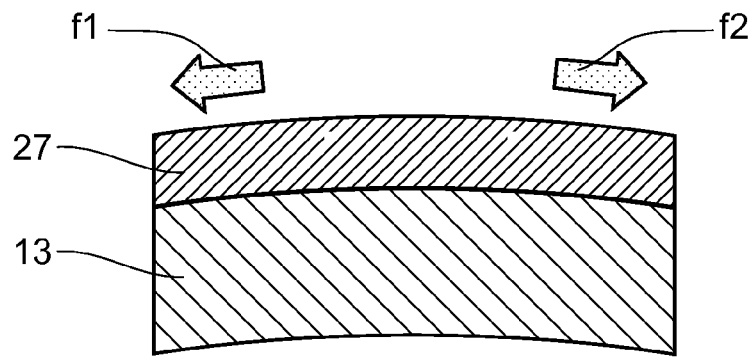

Fig.11
(A)
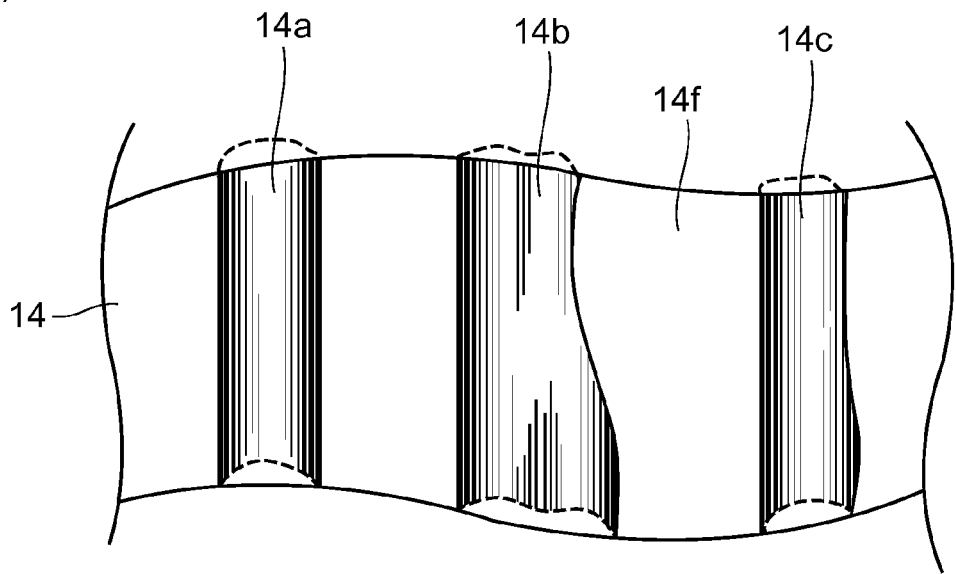
(B)
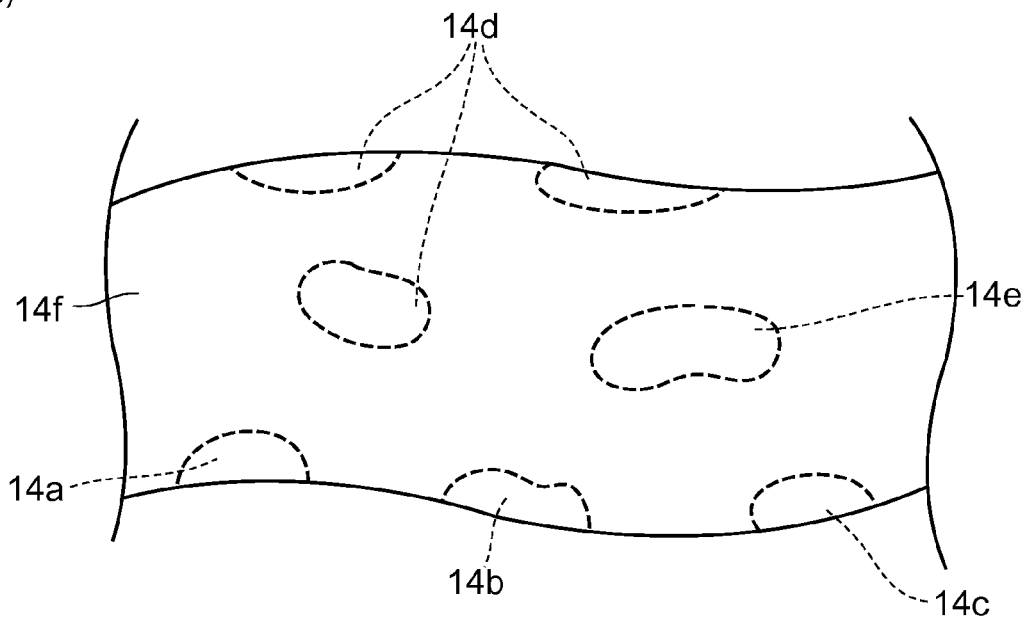

Fig.21
(A)
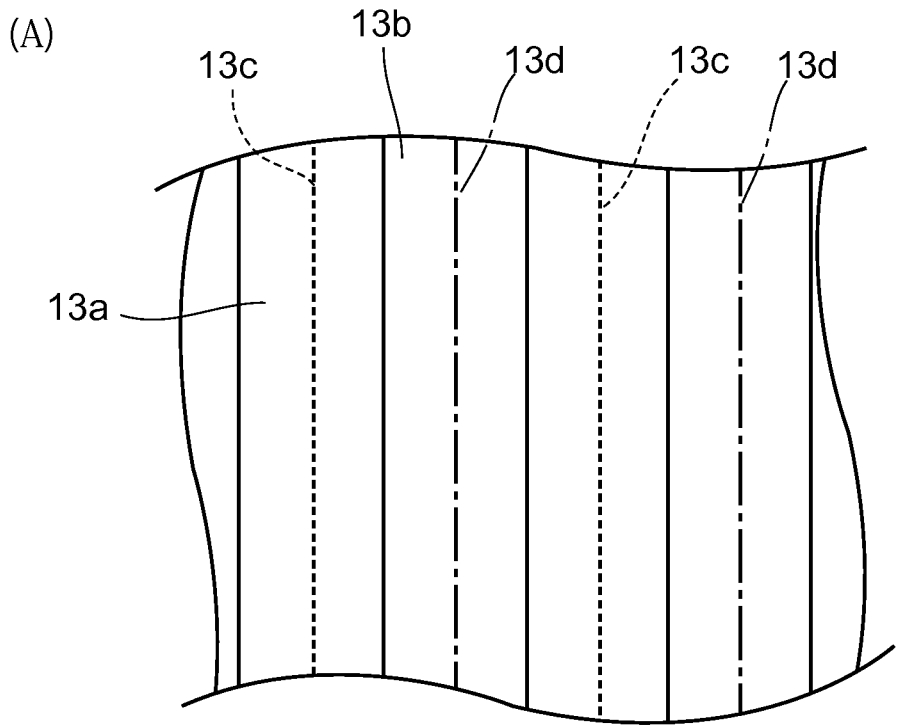
(B)
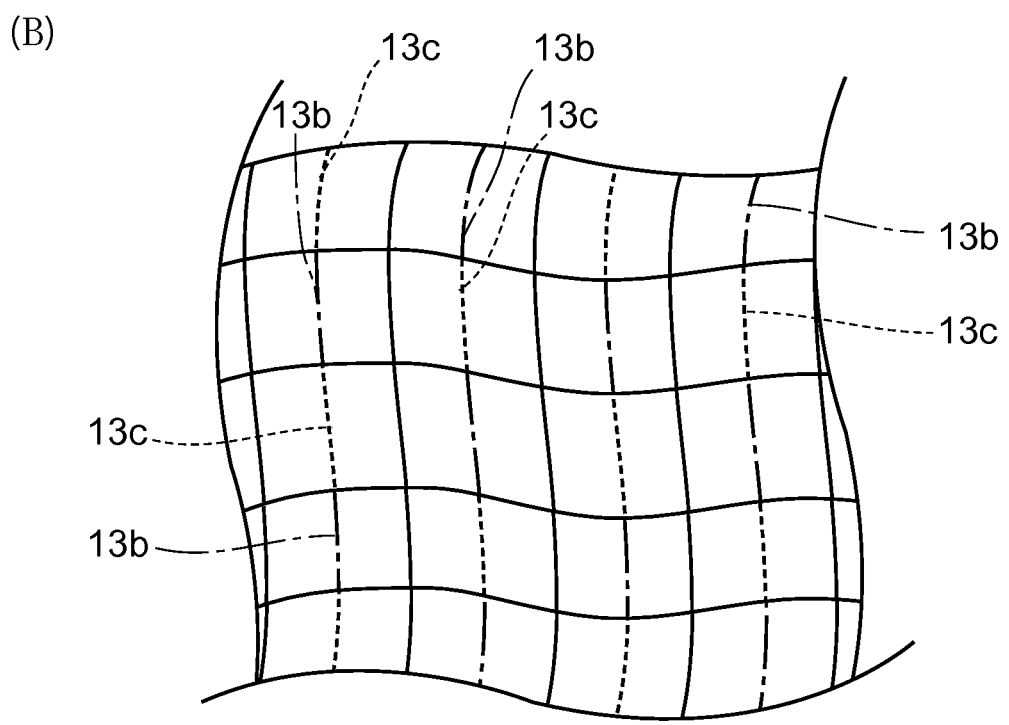

Fig.24
(A)
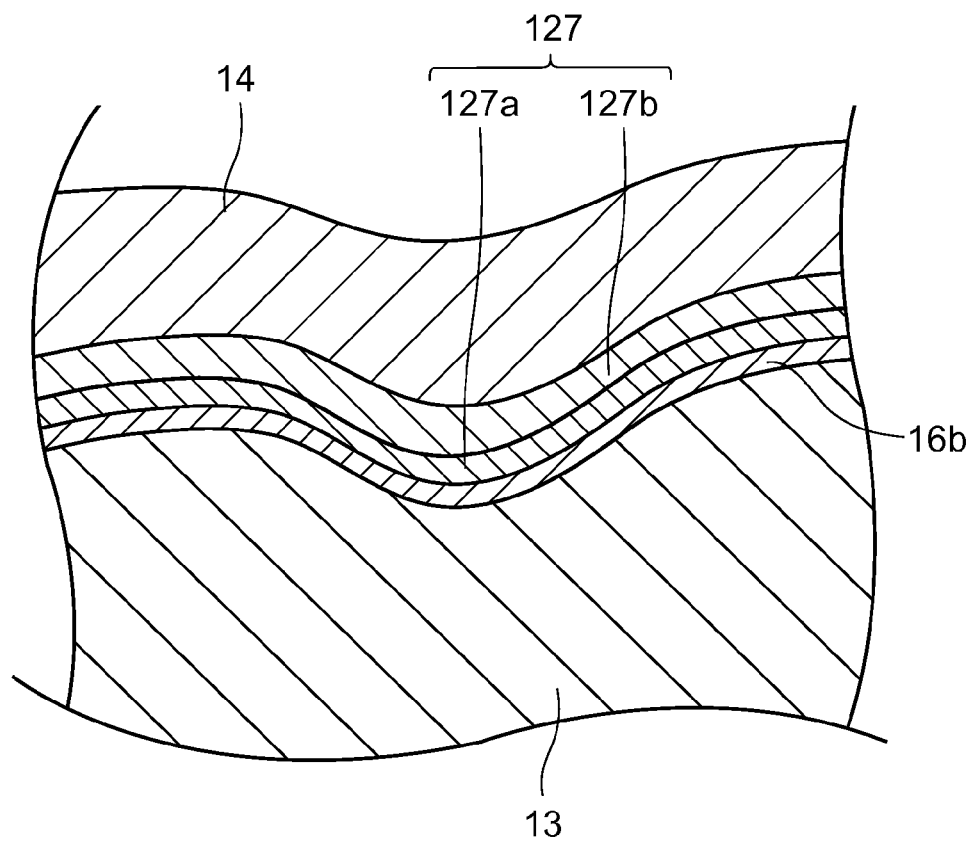
(B)
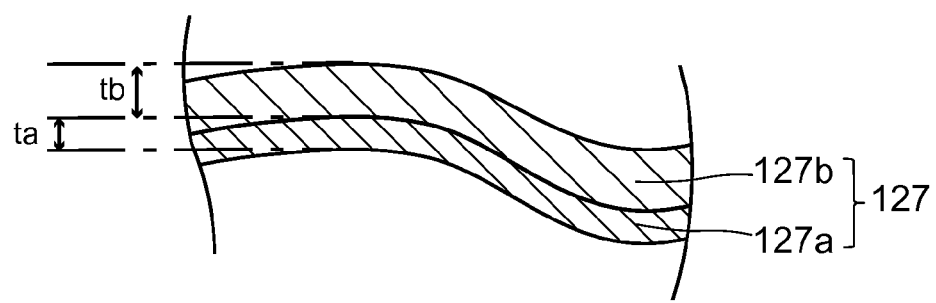

THIN-FILM PIEZOELECTRIC MATERIAL ELEMENT, METHOD OF MANUFACTURING THE SAME, HEAD GIMBAL ASSEMBLY, HARD DISK DRIVE, INK JET HEAD, VARIABLE FOCUS LENS AND SENSOR

CROSS-REFERENCE TO RELATED APPLICATIONS

This application is based upon and claims the benefit of priority from Japanese Patent Application No. 2014-198676, filed Sep. 29, 2014 and Japanese Patent Application No. 2014-239589, filed Nov. 27, 2014, the entire contents of which are incorporated herein by reference.

BACKGROUND

1. Field of the Invention

The present invention relates to a thin-film piezoelectric material element which has a piezoelectric material and electrodes having thin-film like shape and method of manufacturing the same, head gimbal assembly, hard disk drive, ink jet head, variable focus lens and sensor having the thin-film piezoelectric material element.

2. Related Background Art

A hard disk drive has a large recording capacity and is used as the heart of a storage device. The hard disk drive records and reproduces data to/from a hard disk (recording medium) by a thin-film magnetic head. A part, which the thin-film magnetic head is formed, is called as a head slider, and a part, which the head slider is mounted on the edge part, is a head gimbal assembly (will also be referred to as HGA).

Further, recording and reproducing of data to/from the recording medium is performed by flying the head slider from a surface of the recording medium while rotating the recording medium, in the hard disk drive.

On the other hand, it has become difficult to control a position of the thin-film magnetic head accurately by control with only a voice coil motor (VCM), because heightening a recording density of the recording medium has developed in company with increase of a capacity of the hard disk drive. Therefore formerly, a technology, which an actuator having supplementary function (a supplementary actuator) is mounted on the HGA in addition to a main actuator with the VCM, and the supplementary actuator controls a minute position that is not able to be controlled by the VCM, is known, A technology, which the main actuator and the supplementary actuator control the position of the thin-film magnetic head, is also called two stage actuator system (dual-stage system).

In the two stage actuator system, the main actuator makes drive arms rotate to decide a position of the head slider on a specific track of the recording medium. Further, the supplementary actuator adjusts the position of the head slider minutely so that the position of the thin-film magnetic head may become an optimum position.

A micro actuator using a thin-film piezoelectric material element is known formerly as the supplementary actuator. The thin-film piezoelectric material element has a piezoelectric material and a pair of electrodes formed to sandwich the piezoelectric material, and each of them is formed to be a thin-film shape.

Further, for example, as disclosed in the JP 2003-101095 (referred to also as Patent Document 1), the thin-film piezoelectric material element having two layers structure, which two piezoelectric laminated materials including the piezoelectric material are overlaid, is known as the conventional thin-film piezoelectric material element.

The piezoelectric laminated material has a structure which the piezoelectric material and electrode films are formed on a substrate, and it sometimes cause a displacement (also referred to as crooked displacement) along the direction where it is not intended. Further, there is a problem which the piezoelectric laminated material has been curved even a condition which a voltage is not applied to, because stress of each film constituting the piezoelectric laminated material is not equal, or is not symmetrical along to the thickness direction. Accordingly, there is a problem which the piezoelectric laminated material is not able to be mounted on a desired position of the HGA, and the piezoelectric laminated material is broken when it is mounted on the HGA. However, if each piezoelectric laminated material is laminated so that the electrode films, of one pair of electrode films, connected to the outside, oppose each other, crooked displacement caused by each piezoelectric laminated material are canceled each other. Therefore, an effect, which crooked displacement in the whole thin-film piezoelectric material element is suppressed, is obtained. Further an effect, which the thin-film piezoelectric material element is mounted easily on the HGA without broken, is obtained due to canceling curve of each piezoelectric laminated material.

However, on the other hand, it is necessary for the thin-film piezoelectric material element having two layers structure to pile up the piezoelectric laminated material with adhesive. Therefore, there is a problem which both improvement of the mass production capability and lowering of the manufacturing cost are difficult in the thin-film piezoelectric material element having two layers structure.

Hence, conventional method, which a stress occurred between the piezoelectric material and the substrate is released at a manufacturing stage, thereby the crooked displacement and curve (or bowing) are able to be suppressed even the piezoelectric laminated material having single layer, is provided as the method of manufacturing the thin-film piezoelectric material element (see for example, P4897767 (referred to also as Patent Document 2)).

On the other hand, the piezoelectric laminated material having single layer is not able to avoid a generation of stress inside of the piezoelectric laminated material, because it needs a piling up of plurality of thin-films. Therefore, the piezoelectric material elements disclosed in the JP 2012-76387 (referred to also as Patent Document 3), JPH 11-87791 (referred to also as Patent Document 4) are known. The piezoelectric material elements, which electrode of one side has two layers structure and the outside of them is formed with material having small compressing stress than the inside one, so stress of the electrode entirely is relaxed, is disclosed in the Patent Document 3. Further, the piezoelectric material elements, having a structure which two piezoelectric materials are piled up sandwiching a relaxing layer, and two electrodes are arranged both side of the two piezoelectric materials, is disclosed in the Patent Document 4.

SUMMARY OF THE INVENTION

As mentioned in the above-described Patent Documents 2-4, there is a conventional proposal to try to suppress a stress in the piezoelectric laminated material having single layer.

However, in case of the method of manufacturing disclosed in the Patent Document 2, two substrates, which a plurality of thin-films are formed, need to be prepared, so there is a problem which a cost for materials increase. Further, a specific instrument and apparatus are needed when the substrates are adhered each other, so it needs another cost for that. Furthermore, a yield for the piezoelectric laminated material is likely to be decreased by performing adhering process, and two substrates are likely to peel off each other. Accordingly, in case of the method of manufacturing disclosed in the Patent Document 2, both improvement of the mass production capability and lowering of the manufacturing cost are difficult. Further, adhesive layer is likely to peel off each other and is likely to form a gap or crack in the piezoelectric laminated material.

On the other hand, the piezoelectric laminated material (thin-film piezoelectric material element) disclosed in the Patent Documents 3, 4 have a layer for relaxing a stress (stress relaxing layer).

However, in case of the piezoelectric laminated material disclosed in the Patent Document 3, the stress of the piezoelectric laminated material are only able to be decreased, originated in decrease of the stress in the electrodes. Further, in case of the piezoelectric laminated material disclosed in the Patent Document 4, the stress of the piezoelectric laminated material are only able to be decreased, originated in decrease of the stress being transmitted from one of the piezoelectric material to the other piezoelectric material. Therefore, curves (or bowing) of the piezoelectric laminated material are not able to be suppressed sufficiently in these conventional technologies. Further, the supplementary actuator used for hard disk drive does not need the crooked displacement, the crooked displacement are not able to be suppressed in these conventional technologies.

Hence, the present invention is made to solve the above problem, and its object is to make it possible to suppress curve (or bowing) and crooked displacement even the piezoelectric laminated material having a single layer, and to make it possible to manufacture a thin-film piezoelectric material element enhanced a adhesion strength of thin-films without loss of mass production capability and cost decreasing effect, in the thin-film piezoelectric material element, method of manufacturing the same, head gimbal assembly, hard disk drive, ink jet head, variable focus lens and sensor.

To solve the above problem, the present invention is a thin-film piezoelectric material element including: a lower electrode film; a piezoelectric material film; and an upper electrode film; the lower electrode film, the piezoelectric material film and the upper electrode film are laminated sequentially; the piezoelectric material film has an upper surface of the upper electrode film side, and the upper surface is a concavity and convexity surface having a convex part and a concave part, the convex part is a curved surface convexly projected from a center surface of the concavity and convexity surface along a height direction, and the concave part is a curved surface concavely hollowed from the center surface and connected to the convex part, the upper electrode film is formed on the concavity and convexity surface, the thin-film piezoelectric material element including: a stress balancing film having an internal stress capable of cancelling an element stress which the lower electrode film, the piezoelectric material film and the upper electrode film curve convexly toward a direction from the upper electrode film to the lower electrode film, the stress balancing film is formed on the upper electrode film so that a balance between the element stress and the internal stress is secured.

In case of the above-described thin-film piezoelectric material element, the stress balancing film has the internal stress capable of cancelling the element stress, and it is formed on the upper electrode film, thereby balance between the element stress and the internal stress is secured. Further, because the piezoelectric material film has the concavity and convexity surface, the upper electrode film is formed on the concavity and convexity surface, contact area about the piezoelectric material film and the upper electrode film is extended.

Further, it is preferable that the above-described thin-film piezoelectric material element further including: an upper adhesive film formed on the concavity and convexity surface, the upper adhesive film has a film thickness which at least half part from a lower surface of the concavity and convexity surface side to an upper surface of the stress balancing film side enter the concave part, an upper surface of the upper adhesive film of the upper electrode film side is a concavity and convexity surface according to the concavity and convexity surface of the piezoelectric material film, the upper electrode film is formed on the upper surface of the upper adhesive film.

In case of the thin-film piezoelectric material element, because the upper electrode film is formed via the upper adhesive film, adhesive strength of the piezoelectric material film and the upper electrode film is elevated.

Further, in case of the above-described thin-film piezoelectric material element, it is preferable that the upper electrode film has a film thickness which at least a part from a lower surface of the concavity and convexity surface side to an upper surface of the stress balancing film side enter the concave part, the upper surface of the stress balancing film side of the upper electrode film is a concavity and convexity surface according to the concavity and convexity surface of the piezoelectric material film, the stress balancing film is formed on the upper surface of the upper electrode film.

Because the upper surface of the upper electrode film is a concavity and convexity surface according to the piezoelectric material film, contact area with the stress balancing film is extended than a case of plane. Further, the stress balancing film formed on the upper electrode film has a stress including a stress originated in growth of crystal grains and a stress originated in the material.

Further, it is preferable that the stress balancing film is formed with the alloy material which includes iron as the main ingredient, the stress balancing film has a compressive stress which is generated in the neighborhood of grain boundary by contact of adjacent crystal grains, of plurality of crystal grains being formed on the upper electrode film at the time of depositing, caused by their growth, the stress balancing film has the internal stress including the compressive stress.

Further, it is preferable that the lower electrode film is formed as a (100) oriented film, having face-centered cubic structure, which includes the precious metals as the main ingredient, the upper electrode film includes a first metal layer formed on the concavity and convexity surface, a second metal layer formed on the first metal layer, the first metal layer is formed with the precious metals as the main ingredient, the second metal layer is formed with alloy material which has Young's modulus larger than the first metal layer and does not include the precious metals.

In case of the thin-film piezoelectric material element, the precious metals which constitute the lower electrode film and the precious metal which constitute the first metal layer are constituted with the same element.

Further, it is preferable that a thickness of the second metal layer is larger than a thickness of the first metal layer.

It is preferable that the upper electrode film has a film thickness which at least a part from a lower surface of the concavity and convexity surface side of the first metal layer to an upper surface of the stress balancing film side of the second metal layer enter the concave part, the upper surface of the stress balancing film side of the second metal layer is a concavity and convexity surface according to the concavity and convexity surface of the piezoelectric material film, the stress balancing film is formed on the upper surface of the second metal layer.

It is possible that the stress balancing film has a gap part, which is formed by mis-contact of adjacent crystal grains, between adjacent crystal grains.

Furthermore, it is preferable that the thin-film piezoelectric material element further including: a lower adhesive film formed on an upper surface of the lower electrode film of the piezoelectric material film side, the piezoelectric material film is formed on the lower adhesive film.

In case of the thin-film piezoelectric material element, it is preferable that film thicknesses of the stress balancing film and the upper electrode film are decreased in the order.

Further, the present invention provides a method of manufacturing a thin-film piezoelectric material element including a lower electrode film; a piezoelectric material film; and an upper electrode film; the lower electrode film, the piezoelectric material film and the upper electrode film are laminated sequentially, the method including the following steps (1) to (4):
(1) a lower electrode film forming step of forming the lower electrode film on a substrate
(2) a piezoelectric material film forming step of forming the piezoelectric material film on the lower electrode film by sputtering, controlling deposition parameters, including deposition rate according to a deposition of the piezoelectric material, substrate temperature, gas pressure and gas composition, makes an upper surface, of the piezoelectric material film separated side from the substrate, a concavity and convexity surface includes a concave part and a convex part, the convex part is a curved surface convexly projected from a center surface along a height direction, and the concave part is a curved surface concavely hollowed from the center surface and connected to the convex part
(3) an upper electrode film forming step of forming the upper electrode film on the concavity and convexity surface
(4) a stress balancing film forming step of forming a stress balancing film, having an internal stress capable of cancelling an element stress which the lower electrode film, the piezoelectric material film and the upper electrode film curve convexly toward the substrate, on the upper electrode film.

Further, the present invention provides a method of manufacturing a thin-film piezoelectric material element including a lower electrode film; a piezoelectric material film; and an upper electrode film; the lower electrode film, the piezoelectric material film and the upper electrode film are laminated sequentially, the method including the following steps (5) to (8):
(5) a lower electrode film forming step of forming the lower electrode film on a substrate
(6) a piezoelectric material film forming step of forming the piezoelectric material film on the lower electrode film by sol-gel method, controlling deposition parameters, including number of rotations of spin-coating, drying temperature, pre-bake temperature, and oxygen pressure and temperature of a pressure anneal makes an upper surface, of the piezoelectric material film separated side from the substrate, a concavity and convexity surface includes a concave part and a convex part, the convex part is a curved surface convexly projected from a center surface along a height direction, and the concave part is a curved surface concavely hollowed from the center surface and connected to the convex part
(7) an upper electrode film forming step of forming the upper electrode film on the concavity and convexity surface
(8) a stress balancing film forming step of forming a stress balancing film, having an internal stress capable of cancelling an element stress which the lower electrode film, the piezoelectric material film and the upper electrode film curve convexly toward the substrate, on the upper electrode film.

Further, it is preferable that the above-described method of manufacturing further including the following steps (9), (10), the upper adhesive film forming step, the upper electrode film forming step and the stress balancing film forming step are performed in a manner that film thicknesses of the stress balancing film, the upper electrode film and the upper adhesive film are decreased in the order, and at least half part of the upper adhesive film, from a lower surface of the concavity and convexity surface side to an upper surface of the stress balancing film side, enter the concave part.
(9) a lower adhesive film forming step of forming a lower adhesive film on an upper surface of the lower electrode film separated side from the substrate
(10) an upper adhesive film forming step of forming an upper adhesive film on the concavity and convexity surface Further, the present invention provides a head gimbal assembly including a head slider having a thin-film magnetic head; a suspension for supporting the head slider; and a thin-film piezoelectric material element for displacing the head slider relatively to the suspension; the thin-film piezoelectric material element including: a lower electrode film; a piezoelectric material film; and an upper electrode film; the lower electrode film, the piezoelectric material film and the upper electrode film are laminated sequentially; the piezoelectric material film has an upper surface of the upper electrode film side, and the upper surface is a concavity and convexity surface having a convex part and a concave part, the convex part is a curved surface convexly projected from a center surface of the concavity and convexity surface along a height direction, and the concave part is a curved surface concavely hollowed from the center surface and connected to the convex part, the upper electrode film is formed on the concavity and convexity surface, the thin-film piezoelectric material element including: a stress balancing film having an internal stress capable of cancelling an element stress which the lower electrode film, the piezoelectric material film and the upper electrode film curve convexly toward a direction from the upper electrode film to the lower electrode film, the stress balancing film is formed on the upper electrode film so that a balance between the element stress and the internal stress is secured.

Further, the present invention provides a hard disk drive including a head gimbal assembly including a head slider having a thin-film magnetic head, a suspension for supporting the head slider, a thin-film piezoelectric material element for displacing the head slider relatively to the suspension; and a recording medium; the thin-film piezoelectric material element including: a lower electrode film; a piezoelectric material film; and an upper electrode film; the lower electrode film, the piezoelectric material film and the upper electrode film are laminated sequentially; the piezoelectric material film has an upper surface of the upper electrode film side, and the upper surface is a concavity and convexity surface having a convex part and a concave part, the convex part is a curved surface convexly projected from a center surface of the concavity and convexity surface along a height direction, and the concave part is a curved surface concavely hollowed from the center surface and connected to the convex part, the upper electrode film is formed on the concavity and convexity surface, the thin-film piezoelectric material element including: a stress balancing film having an internal stress capable of cancelling an element stress which the lower electrode film, the piezoelectric material film and the upper electrode film curve convexly toward a direction from the upper electrode film to the lower electrode film, the stress balancing film is formed on the upper electrode film so that a balance between the element stress and the internal stress is secured.

Further, the present invention provides an ink jet head including a head main body part including a plurality of nozzles and a plurality of ink chambers which communicate via each the nozzle, a thin-film piezoelectric material element being formed corresponding to the each ink chamber of the head main body part, and which is transformed so as to push out ink accommodated in each the ink chamber in accordance with recording signal; the thin-film piezoelectric material element including a lower electrode film; a piezoelectric material film; and an upper electrode film; the lower electrode film, the piezoelectric material film and the upper electrode film are laminated sequentially; the piezoelectric material film has an upper surface of the upper electrode film side, and the upper surface is a concavity and convexity surface having a convex part and a concave part, the convex part is a curved surface convexly projected from a center surface of the concavity and convexity surface along a height direction, and the concave part is a curved surface concavely hollowed from the center surface and connected to the convex part, the upper electrode film is formed on the concavity and convexity surface, the thin-film piezoelectric material element including: a stress balancing film having an internal stress capable of cancelling an element stress which the lower electrode film, the piezoelectric material film and the upper electrode film curve convexly toward a direction from the upper electrode film to the lower electrode film, the stress balancing film is formed on the upper electrode film so that a balance between the element stress and the internal stress is secured.

Further, the present invention provides a variable focus lens including a lens main body including a transparent substrate, a transparent resin accommodated the inside of the lens main body, a thin-film piezoelectric material element, for transforming the transparent resin, which is adhered to the lens main body; the thin-film piezoelectric material element including a lower electrode film; a piezoelectric material film; and an upper electrode film; the lower electrode film, the piezoelectric material film and the upper electrode film are laminated sequentially; the piezoelectric material film has an upper surface of the upper electrode film side, and the upper surface is a concavity and convexity surface having a convex part and a concave part, the convex part is a curved surface convexly projected from a center surface of the concavity and convexity surface along a height direction, and the concave part is a curved surface concavely hollowed from the center surface and connected to the convex part, the upper electrode film is formed on the concavity and convexity surface, the thin-film piezoelectric material element comprising a stress balancing film having an internal stress capable of cancelling an element stress which the lower electrode film, the piezoelectric material film and the upper electrode film curve convexly toward a direction from the upper electrode film to the lower electrode film, the stress balancing film is formed on the upper electrode film so that a balance between the element stress and the internal stress is secured.

Further, the present invention provides a sensor including a sensor main body including a concavity, a flexible member mounted to the sensor main body so as to cover the concavity, a thin-film piezoelectric material element which is adhered to the flexible member so as to transform the flexible member; the thin-film piezoelectric material element including a lower electrode film; a piezoelectric material film; and an upper electrode film; the lower electrode film, the piezoelectric material film and the upper electrode film are laminated sequentially; the piezoelectric material film has an upper surface of the upper electrode film side, and the upper surface is a concavity and convexity surface having a convex part and a concave part, the convex part is a curved surface convexly projected from a center surface of the concavity and convexity surface along a height direction, and the concave part is a curved surface concavely hollowed from the center surface and connected to the convex part, the upper electrode film is formed on the concavity and convexity surface, the thin-film piezoelectric material element including a stress balancing film having an internal stress capable of cancelling an element stress which the lower electrode film, the piezoelectric material film and the upper electrode film curve convexly toward a direction from the upper electrode film to the lower electrode film, the stress balancing film is formed on the upper electrode film so that a balance between the element stress and the internal stress is secured.

As explained above in detail, in the thin-film piezoelectric material element, method of manufacturing the same, head gimbal assembly, hard disk drive, ink jet head, variable focus lens and sensor, curve and crooked displacement are able to be suppressed even the piezoelectric laminated material having a single layer, and the thin-film piezoelectric material element enhanced a close adhesion of thin-film is able to be manufactured a without loss of mass production capability and cost decreasing effect.

The present invention will be more fully understood from the detailed description given hereinbelow and the accompanying drawings which are given by way of illustration only, and thus are not to be considered as limiting the present invention.

BRIEF DESCRIPTION OF THE DRAWINGS

FIG. 10 is a sectional view in which (A) is showing a step subsequent to that of (B); and (B) is a sectional view showing a step subsequent to that of (A);

FIG. 11 is a side elevation view in which (A) is schematically showing a principal part of the stress balancing film with enlargement; and (B) is a plan view schematically showing a principal part of the stress balancing film with enlargement;

FIG. 21 is a plan view in which (A) is schematically showing the piezoelectric material film according to a modified example; and (B) is a plan view schematically showing the piezoelectric material film according to another modified example;

FIG. 24 is a sectional view, similar with FIG. 6, in which (A) is showing a principal part of FIG. 23 with enlargement; and (B) is a sectional view showing a principal part of (A) with enlargement;

DETAILED DESCRIPTION OF THE EMBODIMENTS

In the following, embodiments of the present invention will be described with reference to the drawings. Note that the same components will be referred to with the same numerals or letters, while omitting their overlapping descriptions.

(Structure of HGA)

Figure 1:
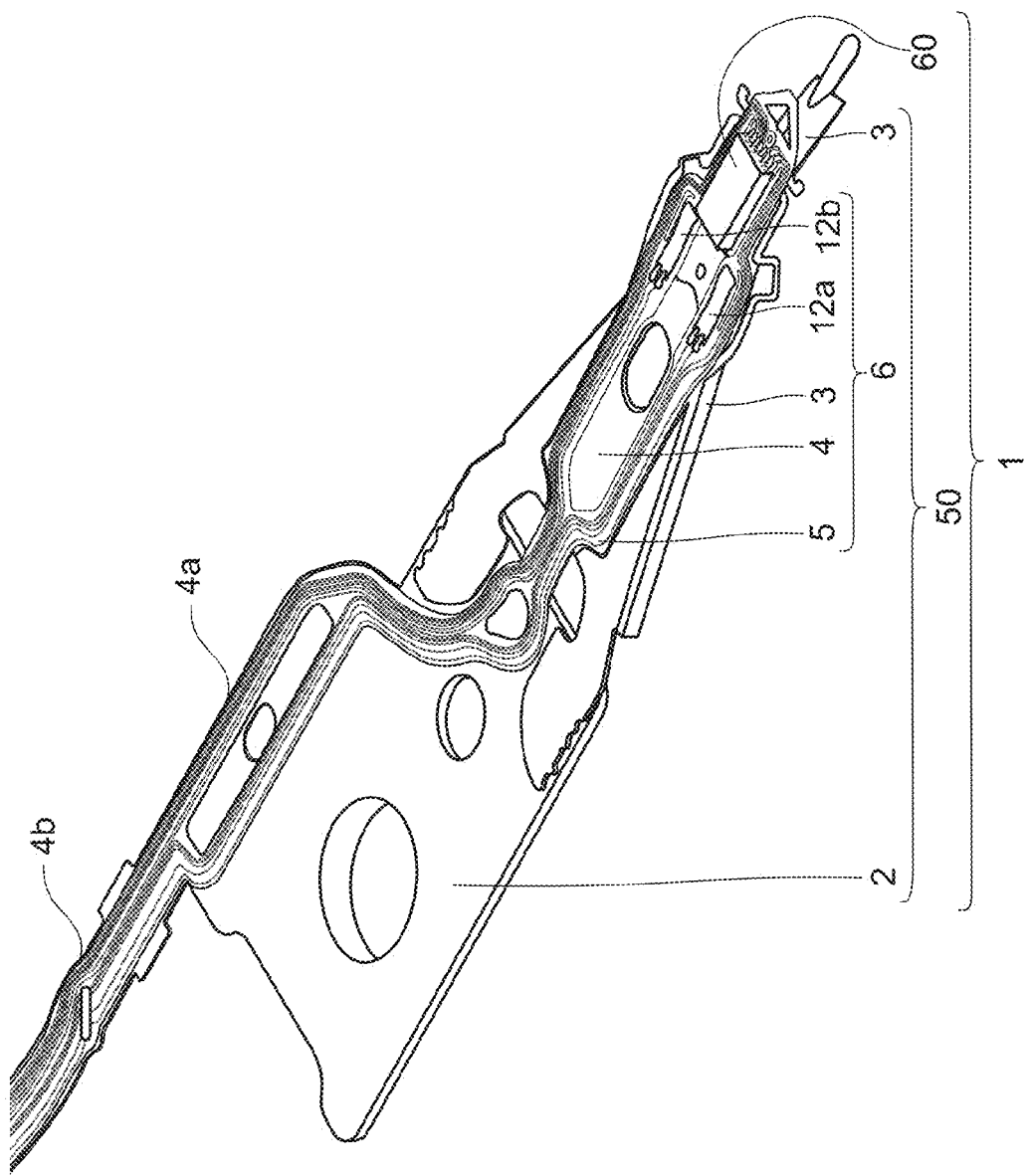
FIG. 1 is a perspective view showing a whole of the HGA, from front side, according to an embodiment of the present invention.
Figure 2:
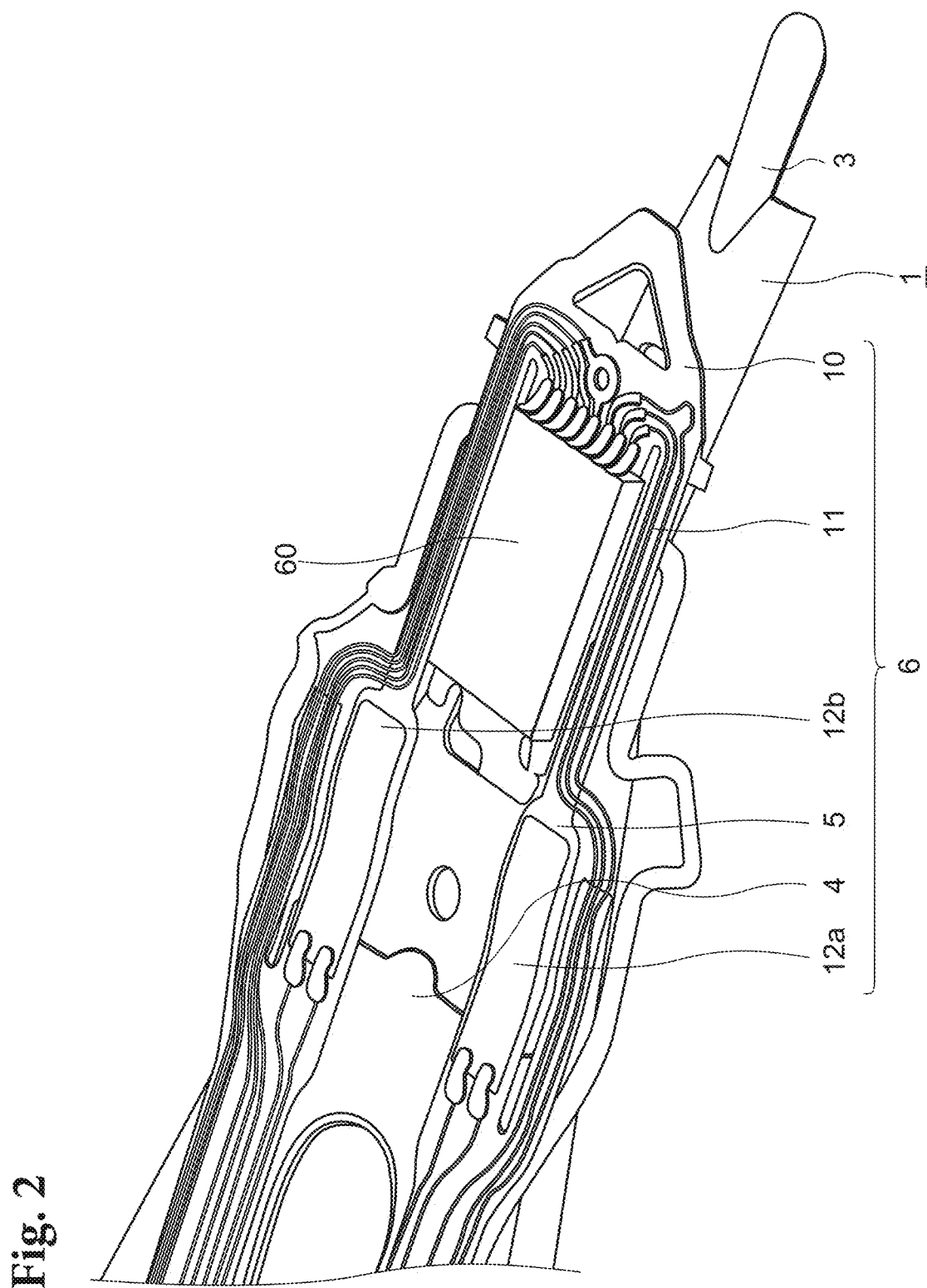
FIG. 2 is a perspective view showing, from front side, a principal part of the HGA in FIG. 1.
Figure 3:
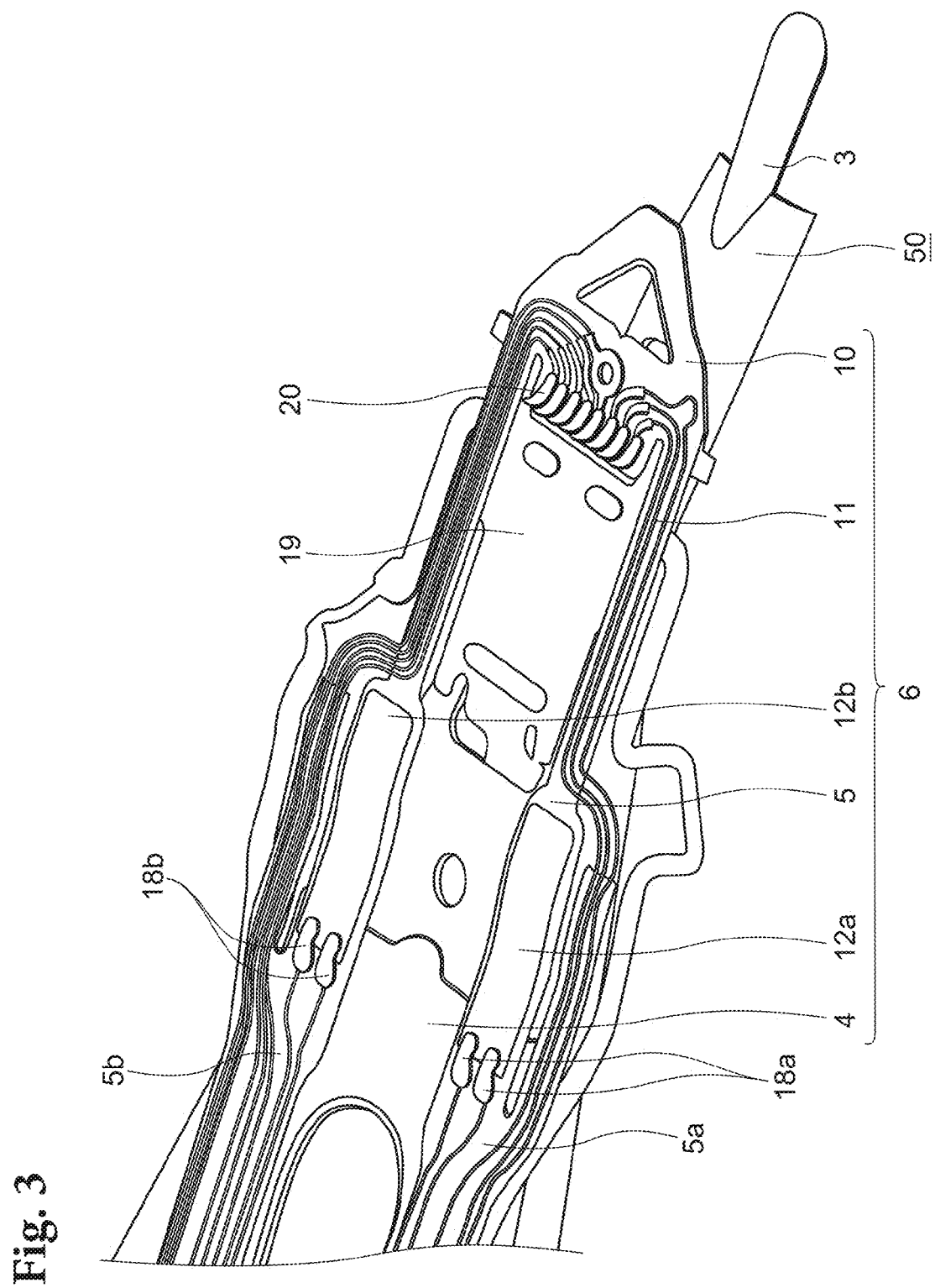
FIG. 3 is a perspective view showing a principal part of a suspension constituting the HGA in FIG. 1 from front side.
Figure 4:
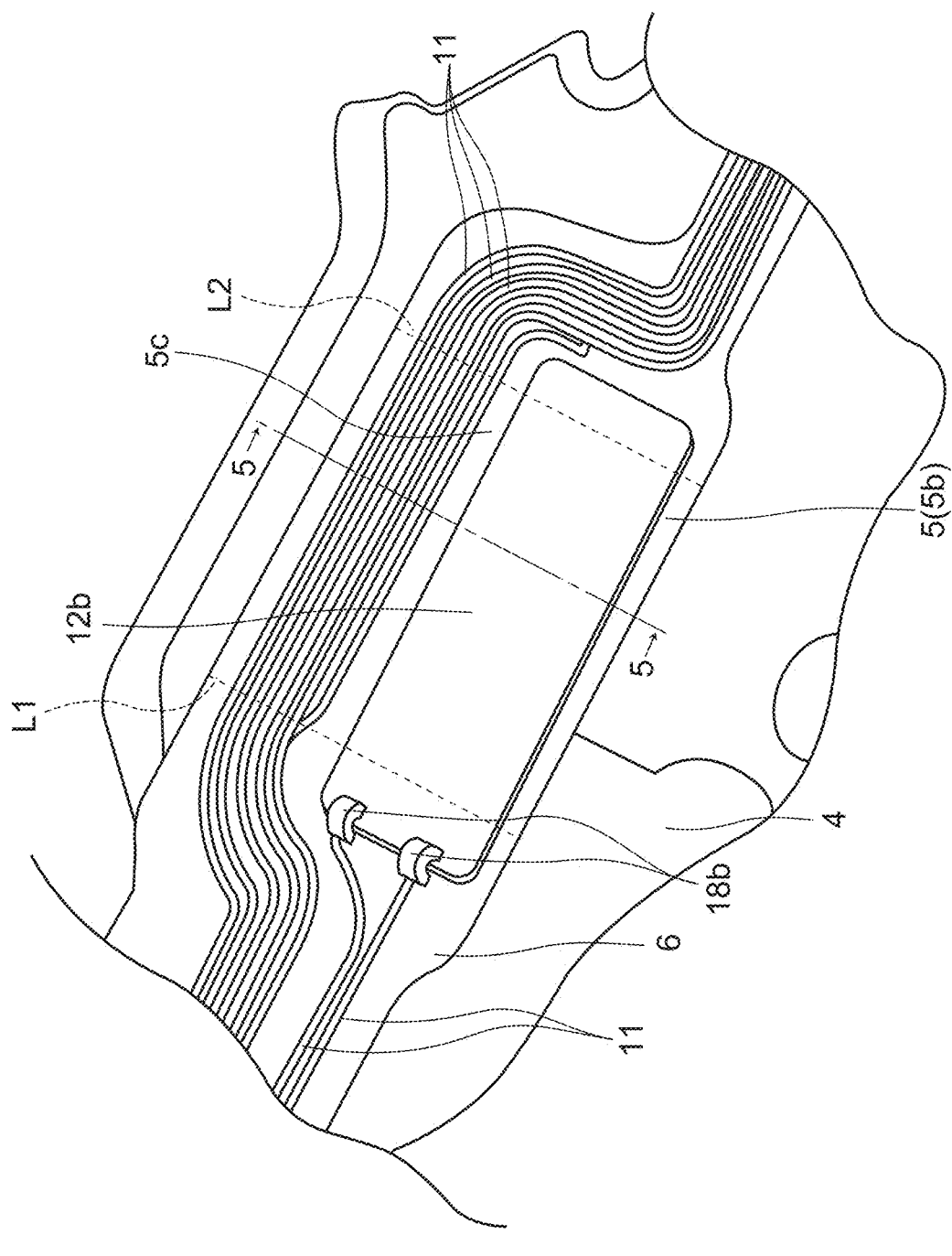
FIG. 4 is a perspective view showing a part of flexure, with enlargement, which a thin-film piezoelectric material element is fixed.
Figure 5:
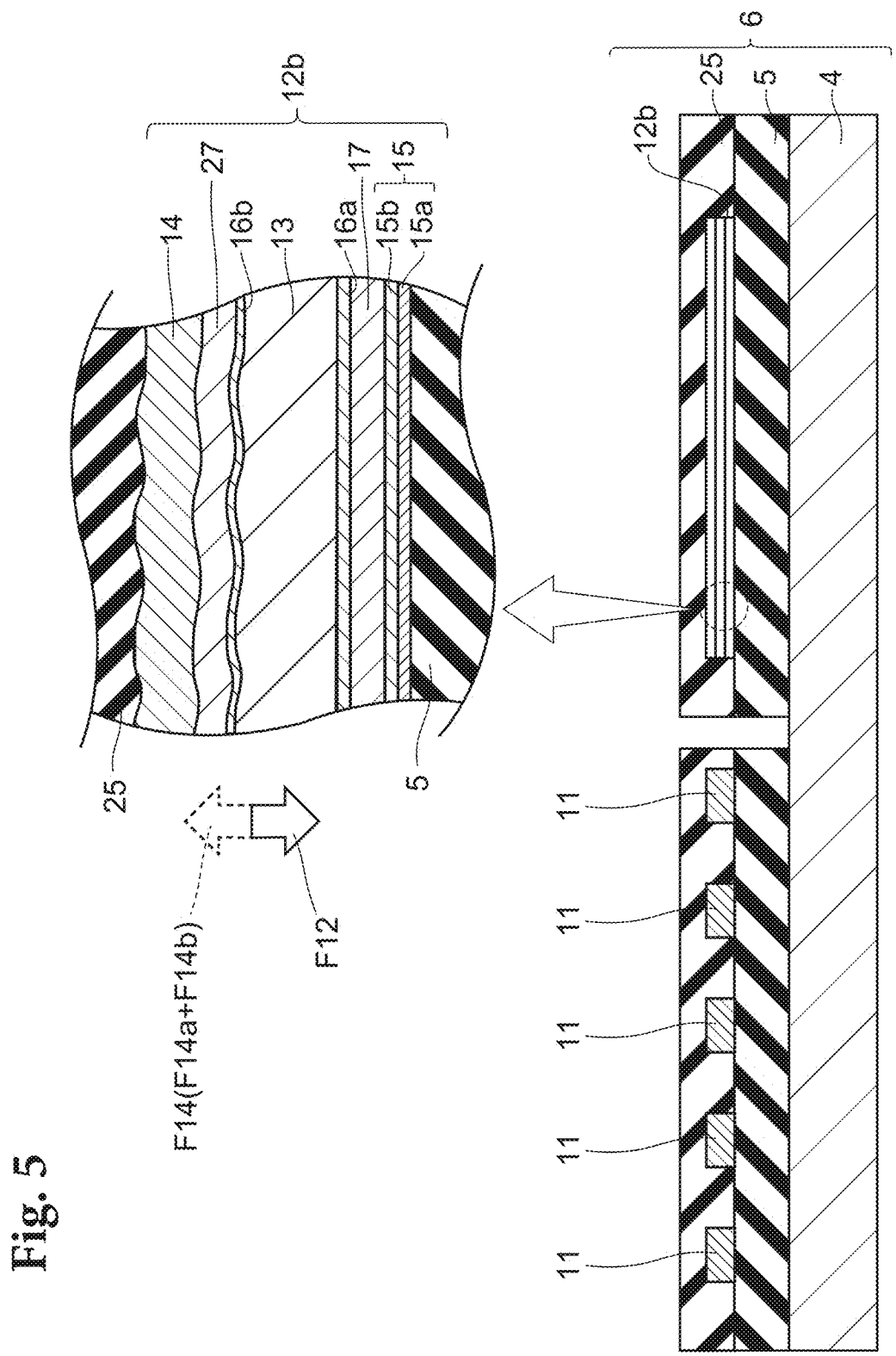
FIG. 5 is a sectional view taken along the line 5-5 in FIG. 4.

To begin with, a structure of the HGA according to the embodiment of the present invention will be explained with reference to FIG. 1 to FIG. 5. Here, FIG. 1 is a perspective view showing a whole of the HGA 1, from front side, according to an embodiment of the present invention. FIG. 2 is a perspective view showing a principal part of the HGA 1 from front side. FIG. 3 is a perspective view showing a principal part of a suspension 50 constituting the HGA 1 from front side. FIG. 4 is a perspective view showing a part of a flexure 6, with enlargement, which a thin-film piezoelectric material element 12b is fixed. FIG. 5 is a sectional view taken along the line 5-5 in FIG. 4.

As illustrated in FIG. 1, the HGA 1 has the suspension 50 and a head slider 60. The suspension 50 has a base plate 2, a load beam 3, the flexure 6 and a dumper not illustrated, and it has a structure which these parts are joined to be united one body by a weld and so on.

The base plate 2 is a part which is used to fix the suspension 50 to a drive arms 209 of a later-described hard disk drive 201, and it is formed with a metal such as stainless steel or the like.

The load beam 3 is fixed on the base plate 2. The load beam 3 has a shape in which the width gradually decreases as it is distanced more from the base plate 2. The load beam 3 has a load bending part which generates a power for pressing the head slider 60 against the later-described hard disk 202 of the hard disk drive 201.

Further, as illustrated in FIG. 1 to FIG. 5, the flexure 6 has a flexure substrate 4, a base insulating layer 5, a connecting wiring 11 and thin-film piezoelectric material elements 12a, 12b, and further it has a later-described protective insulating layer 25. The flexure 6 has a structure which the base insulating layer 5 is formed on the flexure substrate 4, the connecting wiring 11 and thin-film piezoelectric material elements 12a, 12b are adhered on the base insulating layer 5. Further, the protective insulating layer 25 is formed so as to cover the connecting wiring 11 and thin-film piezoelectric material elements 12a, 12b.

The flexure 6 has a piezoelectric elements attached structure which thin-film piezoelectric material elements 12a, 12b are fixed on the surface of the base insulating layer 5 in addition to the connecting wiring 11 to become a structure with piezoelectric element.

Further, the flexure 6 has a gimbal part 10 on the tip side (load beam 3 side). A tongue part 19, which the head slider 60 is mounted, is secured on the gimbal part 10, and a plurality of connecting pads 20 are formed near an edge side than the tongue part 19. Connecting pads 20 are electrically connected to not-illustrated electrode pads of the head slider 60.

This flexure 6 expands or shrinks thin-film piezoelectric material elements 12a, 12b and expands or shrinks stainless part (referred to out trigger part) jut out outside of the tongue part 19. That makes a position of the head slider 60 move very slightly around not-illustrated dimple, and a position of the head slider 60 is controlled minutely.

The flexure substrate 4 is a substrate for supporting a whole of the flexure 6, and it is formed with stainless. Rear side of the flexure substrate 4 is fixed to the base plate 2 and the load beam 3 by weld. As illustrated in FIG. 1, the flexure substrate 4 has a center part 4a fixed to surfaces of the load beam 3 and the base plate 2, and a wiring part 4b extending to outside from the base plate 2.

The base insulating layer 5 covers s surface of the flexure substrate 4. The base insulating layer 5 is formed with for example polyimide, and it has a thickness of about 5 μm to 10 μm. Further, as illustrated in detail in FIG. 3, a part of the base insulating layer 5, disposed on the load beam 3, is divided two parts. One part of them is a first wiring part 5a, the other part of them is second wiring part 5b. The thin-film piezoelectric material element 12a and thin-film piezoelectric material element 12b are adhered on surfaces of each wiring part.

A plurality of connecting wirings 11 are formed on surfaces of each of the first wiring part 5a and the second wiring part 5b. Each connecting wiring 11 is formed with conductor such as copper or the like. One end parts of each connecting wiring 11 are connected to the thin-film piezoelectric material elements 12a, 12b or each connecting pad 20.

The protective insulating layer 25 is formed with for example polyimide. The protective insulating layer 25 has a thickness of about 1 μm to 2 μm, for example.

Further, a not illustrated thin-film magnetic head, which re records and reproduces data, is formed on the head slider 60. Furthermore, a plurality of not illustrated electrode pads are formed on the head slider 60, and each electrode pad is connected to the connecting pads 20.

(Structure of Thin-Film Piezoelectric Material Element)

Figure 6:
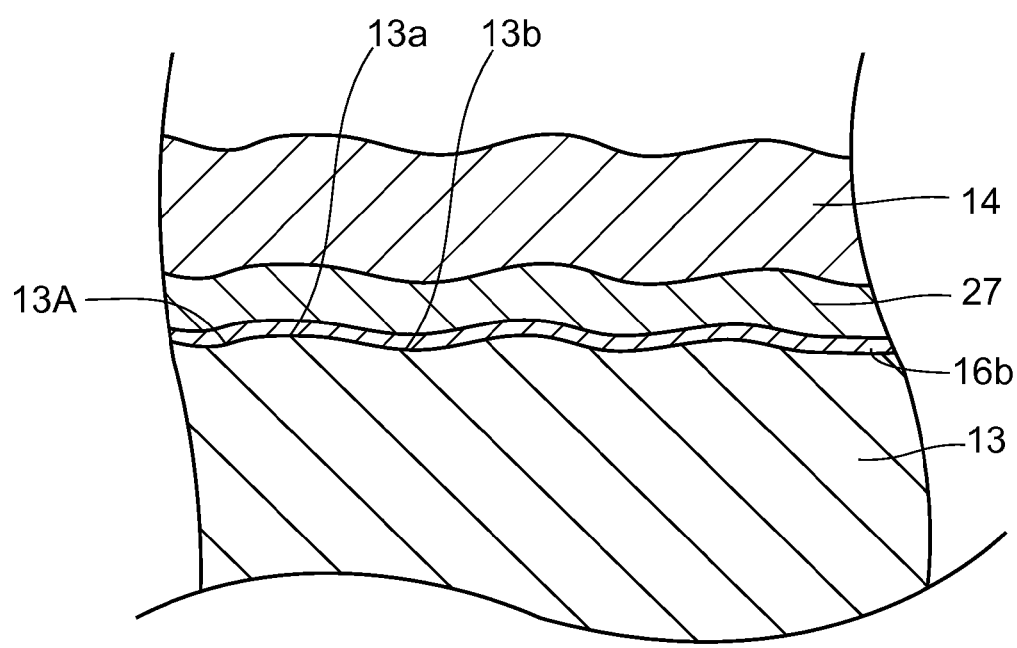
FIG. 6 is a sectional view showing a part of the thin-film piezoelectric material element, with enlargement, from a piezoelectric material film to a stress balancing film.
Figure 7:
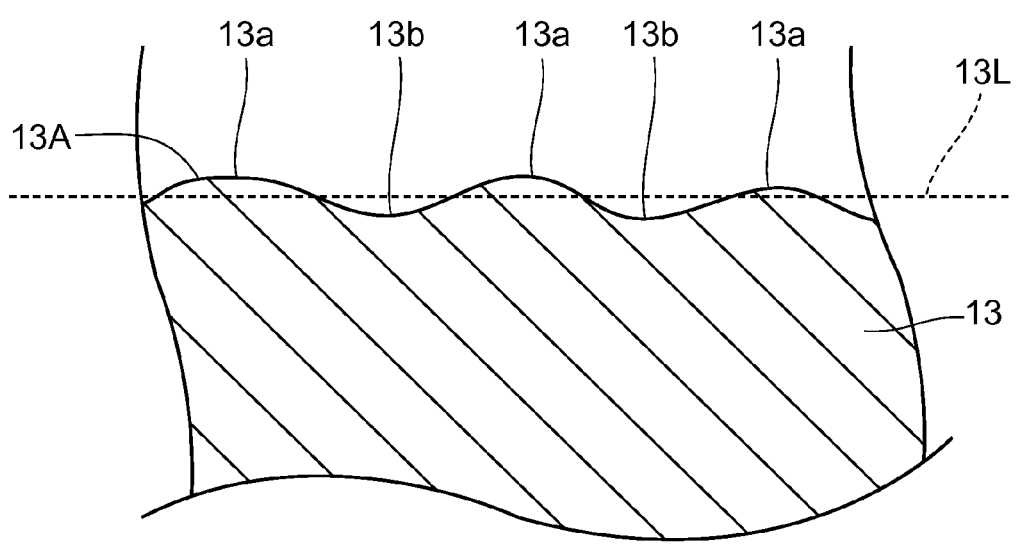
FIG. 7 is a sectional view showing the piezoelectric material film with enlargement.
Figure 8:
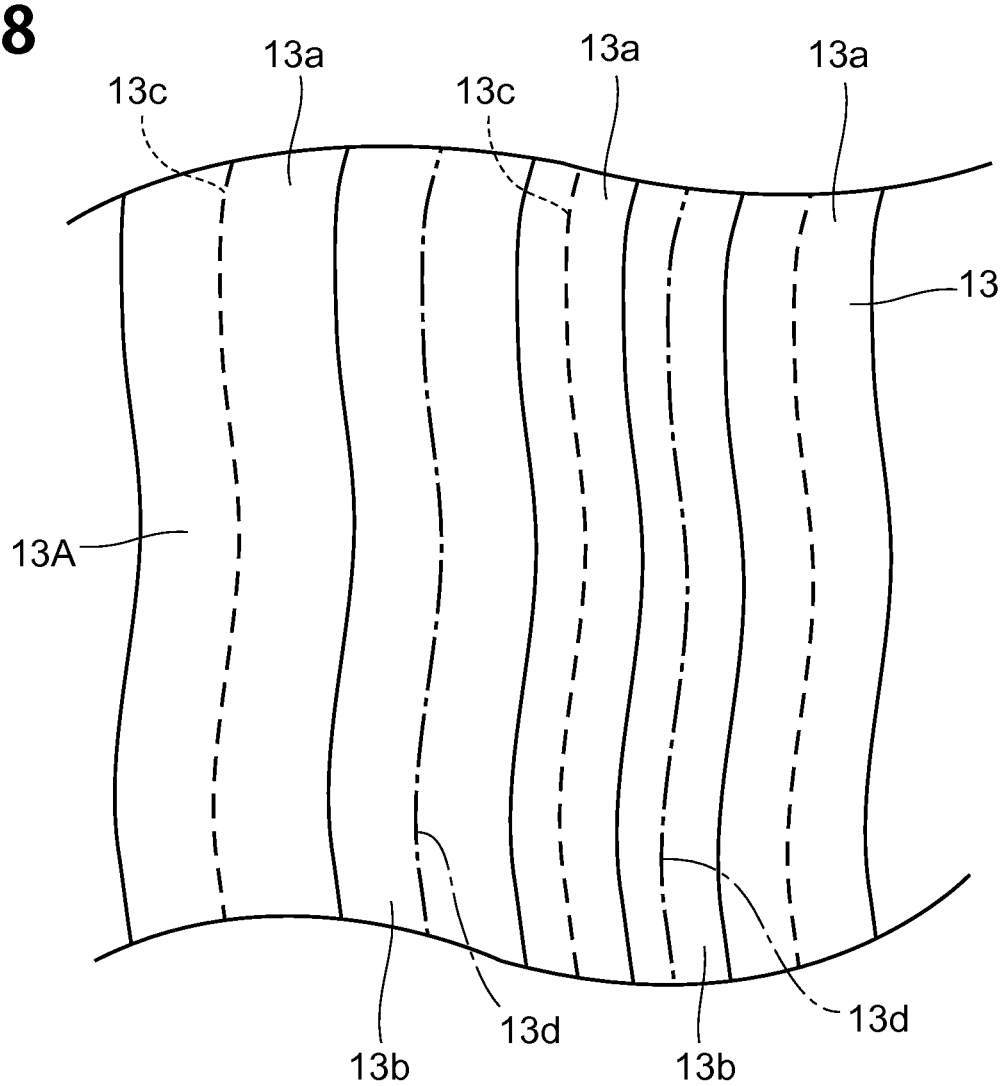
FIG. 8 is a plan view schematically showing an upper surface of the piezoelectric material film.
Figure 20:
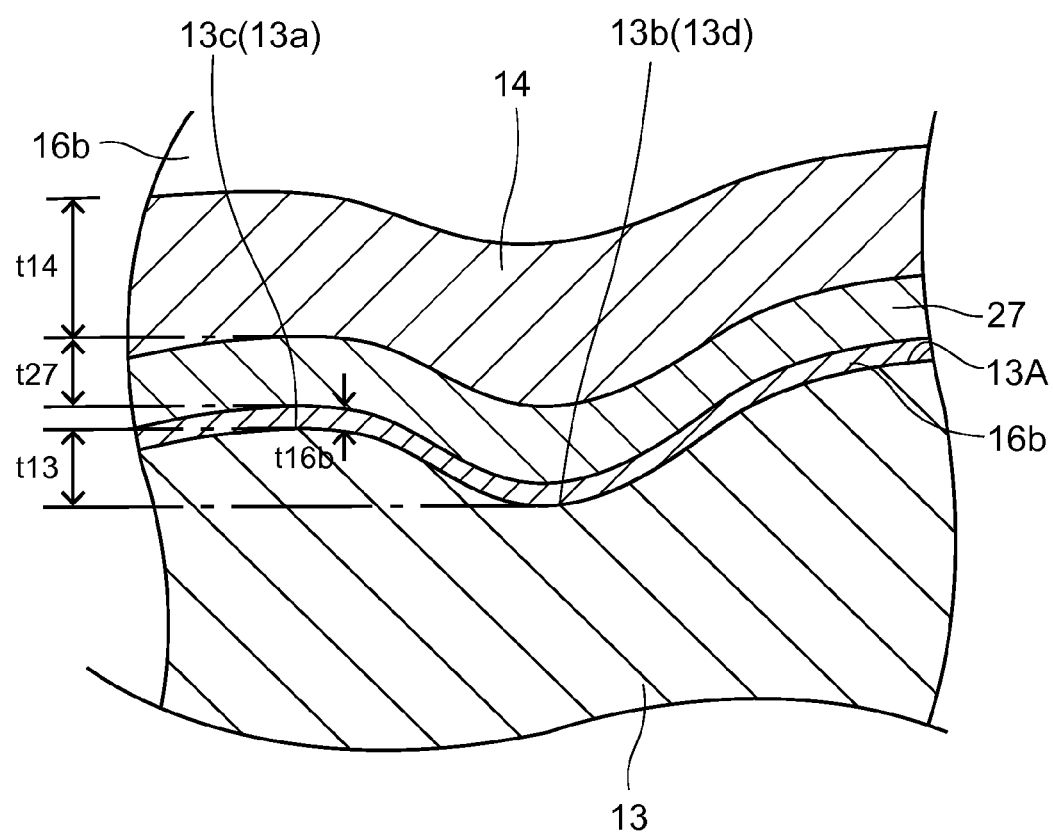
FIG. 20 is a sectional view showing a principal part of FIG. 6 with enlargement.

Subsequently, the structure of thin-film piezoelectric material element will be explained with reference to FIG. 6 to FIG. 8, FIG. 20 in addition to FIG. 5. Here, FIG. 6 is a sectional view showing a part of the thin-film piezoelectric material element 12b, with enlargement, from an after-described piezoelectric material film 13 to a stress balancing film 14. FIG. 7 is a sectional view showing the piezoelectric material film 13 with enlargement. FIG. 8 is a plan view schematically showing an upper surface of the piezoelectric material film 13. FIG. 20 is a sectional view showing a principal part of FIG. 6 with enlargement. Note that each film is described with emphasized concavity and convexity for convenience of illustration, in FIG. 6, FIG. 7, FIG. 20.

The thin-film piezoelectric material element 12b (similar to thin-film piezoelectric material element 12a), as illustrated in detail in FIG. 5, has a ground film 15, a lower electrode film 17, a lower adhesive film 16a, the piezoelectric material film 13, an upper adhesive film 16b, an upper electrode film 27 and the stress balancing film 14, and it has a laminated structure which each film is piled up in order. In the thin-film piezoelectric material element 12b, the stress balancing film 14 is formed on the upper electrode film 27 so as to secure a balance between a later-described element stress F12 and an internal stress F14. The thin-film piezoelectric material elements 12b, 12a are adhered to the surface of the base insulating layer 5 with not-illustrated epoxy resin.

Note that "upper" and "lower" in the present invention do not show necessarily upper side, lower side in a condition which the thin-film piezoelectric material element is adhered on the base insulating layer 5. These words are terms for reasons of convenience so as to distinguish two electrode films and so on opposing each other with the piezoelectric material film 13 between. In the actual products, the upper electrode film 27 and the upper adhesive film 16b are sometimes disposed lower side, and the lower electrode film 17 and the lower adhesive film 16a are sometimes disposed upper side.

The piezoelectric material film 13 is formed to be a thin-film shape using a piezoelectric material such as lead zirconate titanate ((Pb (Zr,Ti) $O_3$) which will also be referred to as "PZT" in the following) or the like. The piezoelectric material film 13 is formed by epitaxial growth and it has a thickness of about 2 μm to 5 μm. A piezoelectric ceramics (much of them are ferroelectric substance) such as barium titanate, lead titanate or the like, non-lead system piezoelectric ceramics not including titanium or lead are able to be used for the piezoelectric material film 13 instead of using PZT.

Further, in this embodiment, as illustrated in FIG. 6, FIG. 7, a surface of the upper electrode film 27 side of the piezoelectric material film 13 (referred to also as upper surface) is a concavity and convexity surface 13A. The concavity and convexity surface 13A has a plurality of bending convex parts 13a and bending concave parts 13b. In the concavity and convexity surface 13A, each convex part 13a and concave part 13b are arranged one after the other along the concavity and convexity surface 13A, and its sectional form is a wave form. Each convex part 13a and concave part 13b are curved surfaces which slant gently. In this embodiment, an outside part, convexly projected from a center surface 13L along the height direction of the concavity and convexity surface 13A, is the convex part 13a, an inside part, concavely hollowed from the center surface 13L and connected to the convex part 13a, is the concave part 13b.

Further, as illustrated in FIG. 8, each convex part 13a may have a ridge part 13c, and each concave part 13b may have a bottom of ravine part 13d. The ridge part 13c is a linear peak part which a plurality of tops are connected to be formed band shape. The bottom of ravine part 13d is groove like part which a plurality of bottom parts are connected to be formed band shape along the convex part 13a. Further, each ridge part 13c and bottom of ravine part 13d have meandering structure respectively, and they extend along the length direction with crooking in left-right direction (direction intersecting with the thickness direction of the thin-film piezoelectric material element 12b). Note that the upper surface of the piezoelectric material film 13 is not a surface which the convex part 13a and the concave part 13b having band shape, as illustrated in FIG. 8, are arranged one after the other, it may be a surface which a convex part and a concave part having different size and form are arranged one after the other, though they are not illustrated.

Furthermore, as illustrated in FIG. 20, a height difference between the convex part 13a and concave part 13b (referred to also as surface roughness) of the concavity and convexity surface 13A is t13. And, a film thickness tl6b (about 35 nm) of the later-described upper adhesive film 16b is almost equal to the surface roughness t13 or slightly larger than the surface roughness t13. It is sufficient that at least half part from a lower surface to an upper surface of the upper adhesive film 16b enter the concave part 13b, as illustrated in FIG. 6, almost the whole part enter the concave part 13b. By this, as illustrated in FIG. 6, FIG. 8, the upper adhesive film 16b has a concavity and convexity structure according to the concavity and convexity surface 13A of the piezoelectric material film 13, the upper surface of the upper adhesive film 16b becomes concavity and convexity surface according to the concavity and convexity surface 13A. In this case, the upper surface of the upper adhesive film 16b has a convex part and a concave part according to the concavity and convexity surface 13A.

Further, a film thickness t27 of the later-described upper electrode film 27 has a size, which at least a part from the lower surface (surface of the concavity and convexity surface 13A side) to the upper surface (surface of the stress balancing film 14 side) of the upper electrode film 27 enters the concave part 13b. Because the film thickness t27 has such size, the upper electrode film 27 has also a concavity and convexity structure according to the concavity and convexity surface 13A of the piezoelectric material film 13, and its upper surface becomes concavity and convexity surface according to the concavity and convexity surface 13A. Further, a film thickness t14 (about 100 nm) of the later-described stress balancing film 14 is larger than the film thickness t27 (t27<t14).

The ground film 15 is formed with zirconium oxide, yttrium oxide, magnesium oxide, rare earth elements oxide, nitride such as titanium nitride or the like. The ground film 15 as illustrated in FIG. 5 has a first ground film 15a and a second ground film 15b, and it has two layers structure which the second ground film 15b is formed on the first ground film 15a. However, the ground film 15 does not need to have two layers structure.

The lower electrode film 17 is a thin-film (thickness about 100 nm) made of metal element which has Pt (it may include Au, Ag, Pd, Ir, Ru, Cu, in addition to Pt) as main ingredient, it is formed on the ground film 15. A crystal structure of the lower electrode film 17 is a face-centered cubic structure. The lower adhesive film 16a is a thin-film (thickness about 20 nm) made of conductive material formed by epitaxial growth such as $SrRuO_3$ (referred to also as SRO) or the like, and it is formed on an upper surface of the piezoelectric material film 13 side of the lower electrode film 17. The piezoelectric material film 13 is formed on the lower adhesive film 16a.

The upper adhesive film 16b is a thin-film (thickness about 35 nm) made of amorphous conductive material such as $SrRuO_3$ or the like, and it is formed on the concavity and convexity surface 13A of the piezoelectric material film 13. As described above, the upper surface of the upper adhesive film 16b becomes a concavity and convexity surface according to the concavity and convexity surface 13A.

The upper electrode film 27 is a polycrystal thin-film (thickness about 50 nm) with metal element which has Pt (it may include Au, Ag, Pd, Ir, Rh, Ni, Pb, Ru, Cu, in addition to Pt) as main ingredient, it is formed on the upper adhesive film 16b. As described above, the upper surface of the upper electrode film 27 is a concavity and convexity surface according to the concavity and convexity surface 13A. Further, a crystal structure of the upper electrode film 27 is a face-centered cubic structure.

The stress balancing film 14 is formed on the upper electrode film 27. The stress balancing film 14 is a polycrystal thin-film (thickness about 100 nm) using alloy material. The stress balancing film 14 has an internal stress F14 which is able to cancel (be able to offset) the later-described element stress F12.

The stress balancing film 14 is formed with alloy material which has iron (Fe) as main ingredient, for example. It is preferable that a crystal structure of the stress balancing film 14 is body-centered cubic structure. It is preferable that the stress balancing film 14 is formed with alloy material which includes Fe and at least any one of Co, Mo, Au, Pt, Al, Cu, Ag, Ta, Cr, Ti, Ni, Ir, Nb, Rb, Cs, Ba, V, W, Ru. Further, it is more preferable that the stress balancing film 14 is formed with alloy material which includes Fe and Co, Mo.

Here, the element stress F12 is a stress which the lower electrode film 17, the piezoelectric material film 13 and the upper electrode film 27 curve convexly along the direction from the upper electrode film 27 to the lower electrode film 17 (downward in FIG. 5), in thin-film piezoelectric material elements 12b. The internal stress F14 is a stress which the stress balancing film 14 has. The internal stress F14 operates so as to spread the stress balancing film 14 toward outside, and make it curve convexly along upward.

Because the stress balancing film 14 having the compressive stress is formed on the upper electrode film 27, the stress balancing film 14 pulls up the upper electrode film 27 upward direction, and the internal stress F14 operates so as to cancel the element stress F12, thereby a balance of stress is secured. Note that the internal stress F14 is a stress (resultant stress) which both a stress F14a originated in a material forming the stress balancing film 14 and a stress F14b originated in a later-described growth of crystal grains of the stress balancing film 14 are composed, it is described in detail later.

Further, the stress balancing film 14 may have a plurality of gap parts 14a, 14b, 14c, 14d, 14e, as illustrated in FIG. 11(A). Each gap part is a minute vacant space (or point defect) which is formed by mis-contact of adjacent crystal grains of crystal grains formed at deposition. In case these gap parts exist, the internal stress of the stress balancing film 14 become to be controlled easily, stress balance become to be performed easily.

Figure 15:
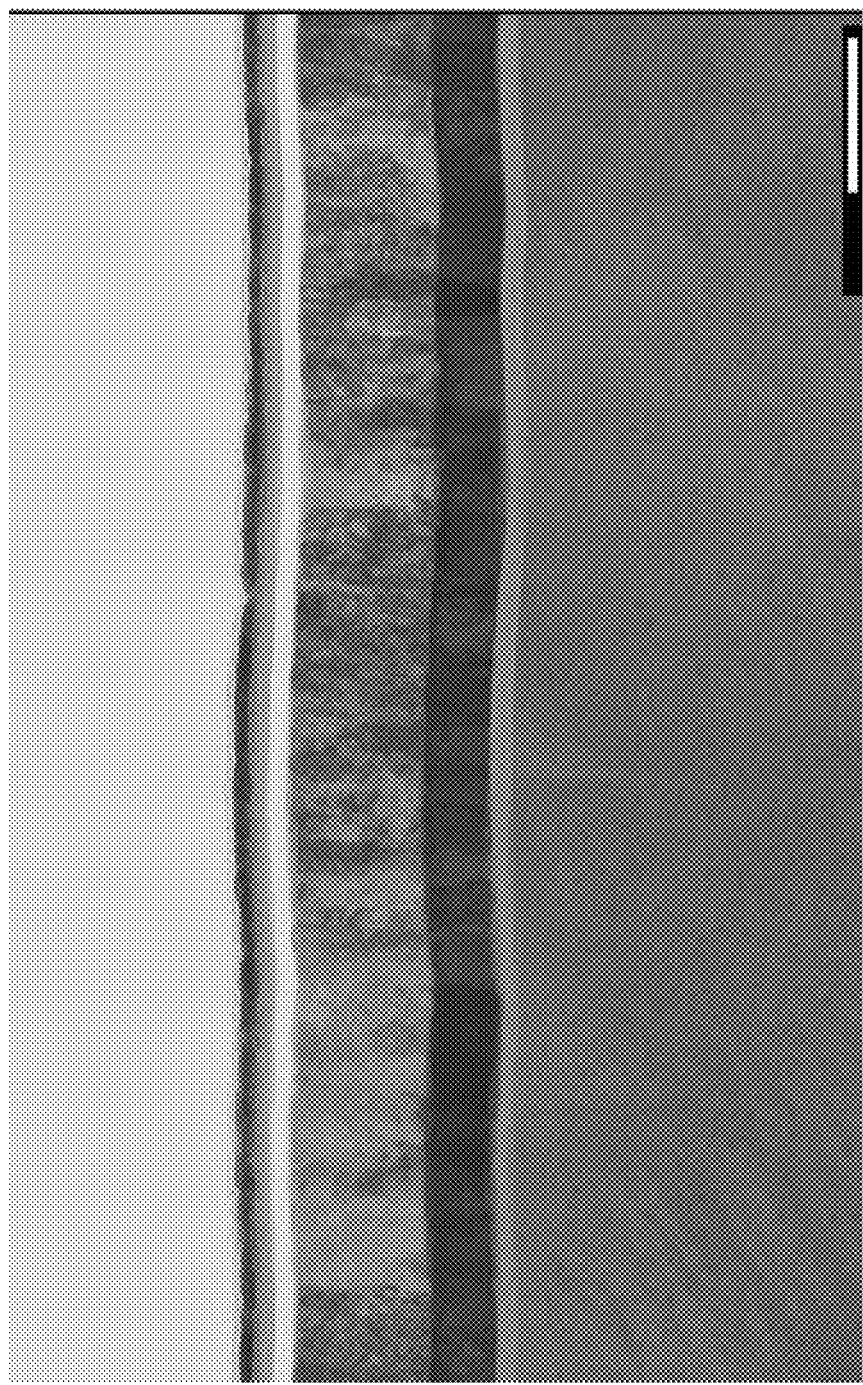
FIG. 15 is a SEM image showing a part of the thin-film piezoelectric material element manufactured by the present inventor from the piezoelectric material film to an upper electrode film.
Figure 16:
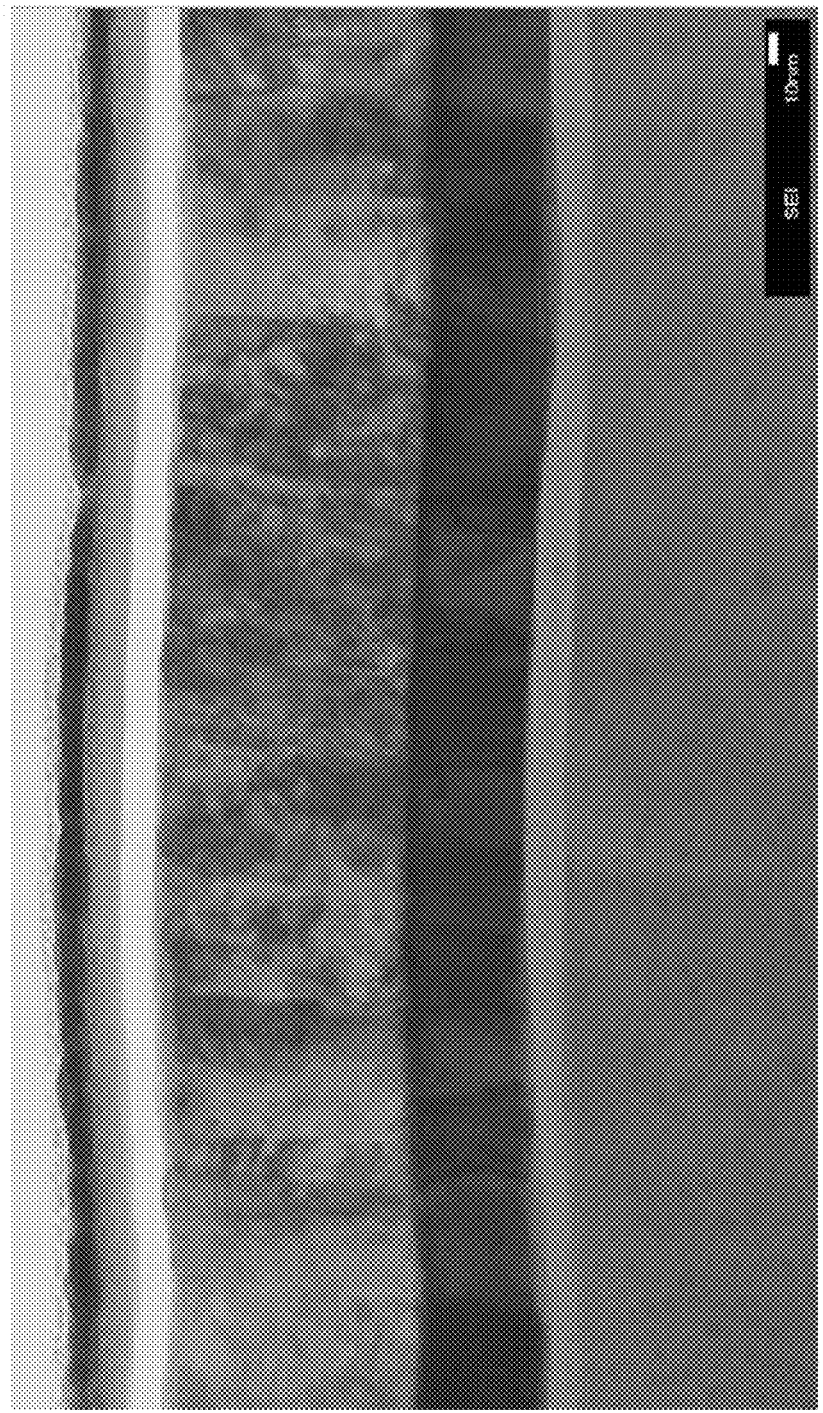
FIG. 16 is a SEM image showing a principal part of FIG. 15 with enlargement.
Figure 17:
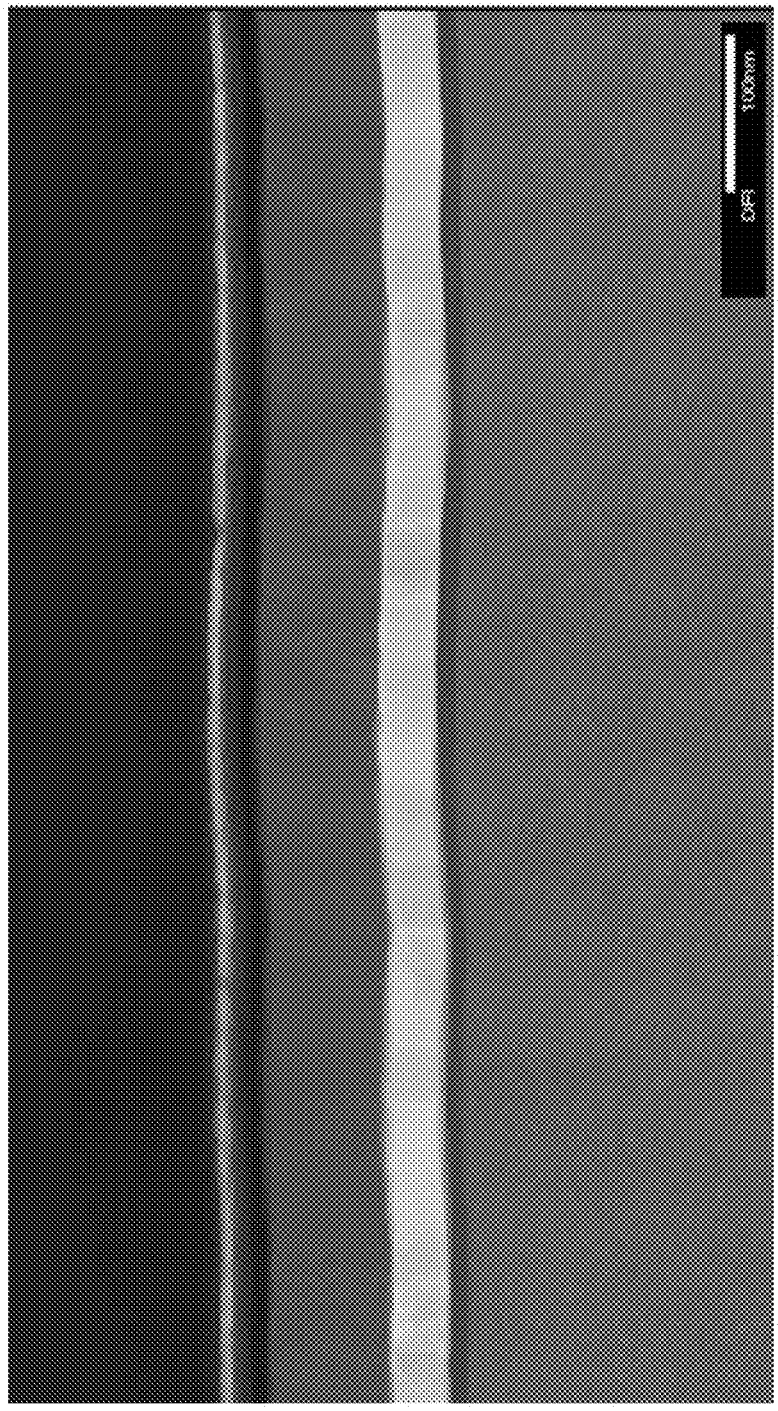
FIG. 17 is a SEM image showing a principal part of FIG. 16 with enlargement.
Figure 18:
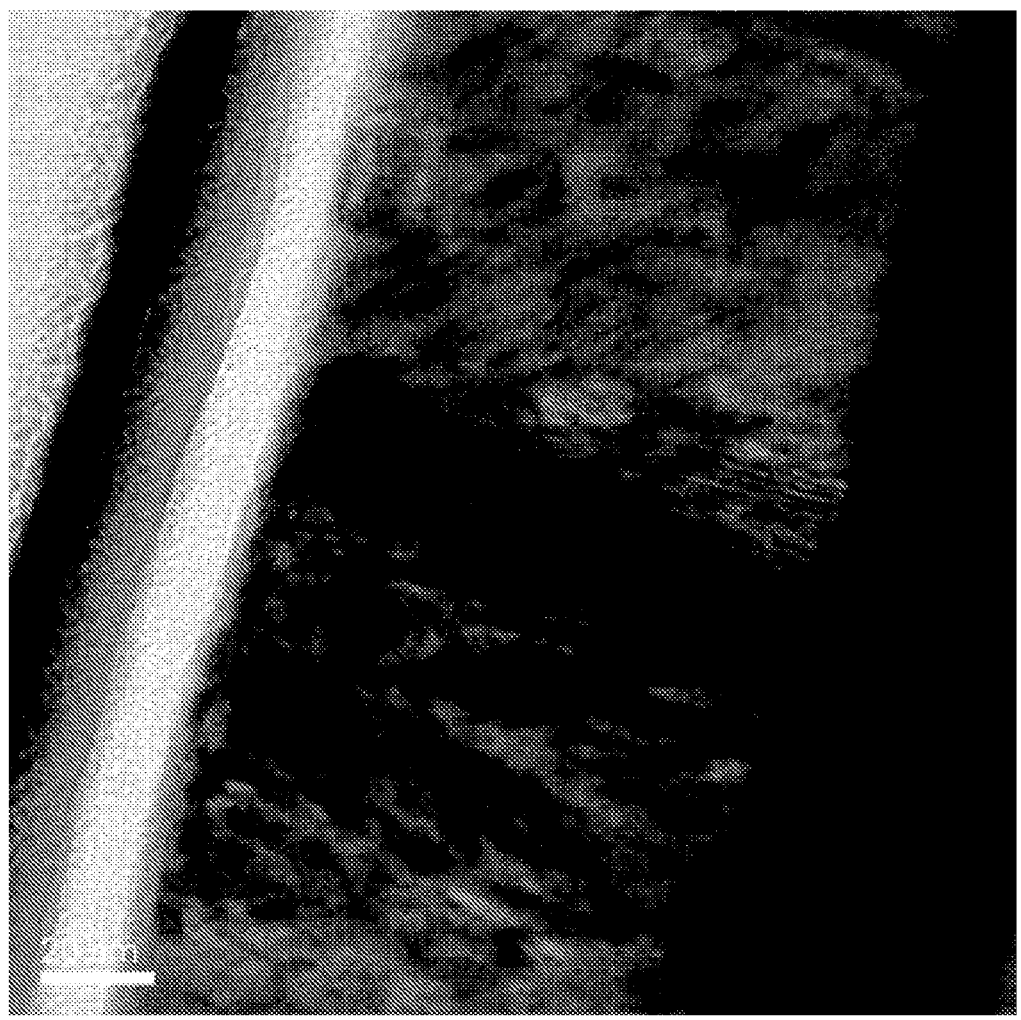
FIG. 18 is a TEM image showing the stress balancing film.
Figure 19:
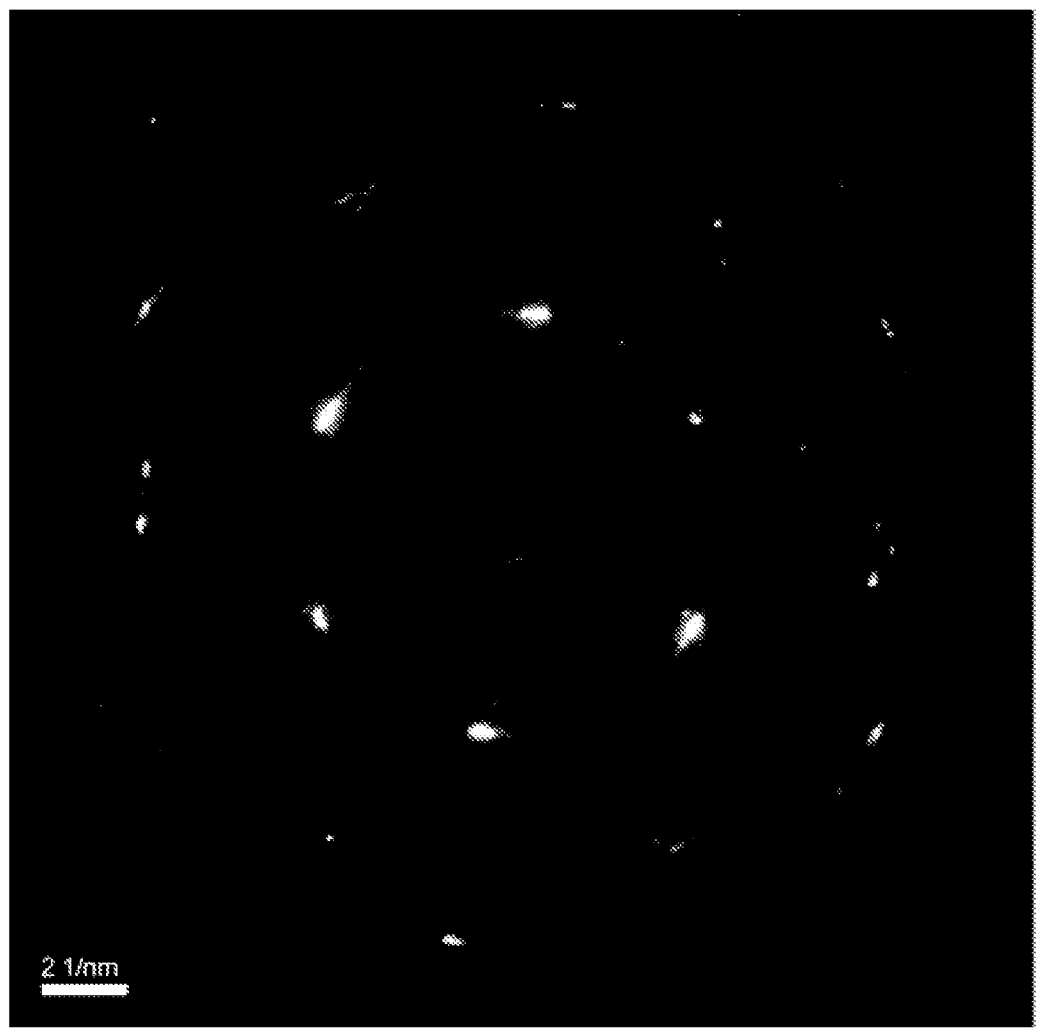
FIG. 19 is a TEM image showing a SAD pattern in FIG. 18.

Here, FIG. 15 to FIG. 17 are SEM (Scanning Electron Microscope) images showing a part of the thin-film piezoelectric material element 12b manufactured by the present inventor from the piezoelectric material film 13 to the upper electrode film 27. As illustrated in these drawings, the upper surface of the piezoelectric material film 13 has the concavity and convexity structure. FIG. 18 is a TEM (Transmission Electron Microscope) image showing a part of the stress balancing film 14. FIG. 19 is a TEM image showing a SAD (Selected Area Diffraction) pattern in FIG. 18.

Not illustrated wirings are formed on the upper electrode film 27 and the lower electrode film 17. These wirings are connected to the connecting wirings 11 via electrode pads 18a, 18b.

The protective insulating layer 25 covers the surface of the base insulating layer 5 so as to cover all surfaces of the connecting wirings 11, the thin-film piezoelectric material element 12a and the thin-film piezoelectric material element 12b. The protective insulating layer 25 is formed with polyimide for example, and it has a thickness of about 5 μm to 10 μm. It is preferable that the protective insulating layer 25 is manufactured together with not-illustrated cover layer of the flexure 6. However, thin-film piezoelectric material elements 12a, 12b do not need to be covered with the protective insulating layer 25, when thin-film piezoelectric material elements 12a, 12b have a protective insulating layer.

Further, the flexure 6 has a structure (piezoelectric element incorporated structure) which the thin-film piezoelectric material element 12a and the thin-film piezoelectric material element 12b are incorporated inside together with the connecting wirings 11, because the protective insulating layer 25 is formed on the surface.

Note that the connecting wirings 11, thin-film piezoelectric material element 12a and thin-film piezoelectric material element 12b are illustrated in FIG. 2 to FIG. 4 for convenience of illustration, however, they are covered with the protective insulating layer 25, so they are not exposed on the surface of the flexure 6.

(Method of Manufacturing Thin-Film Piezoelectric Material Element)

Figure 12:
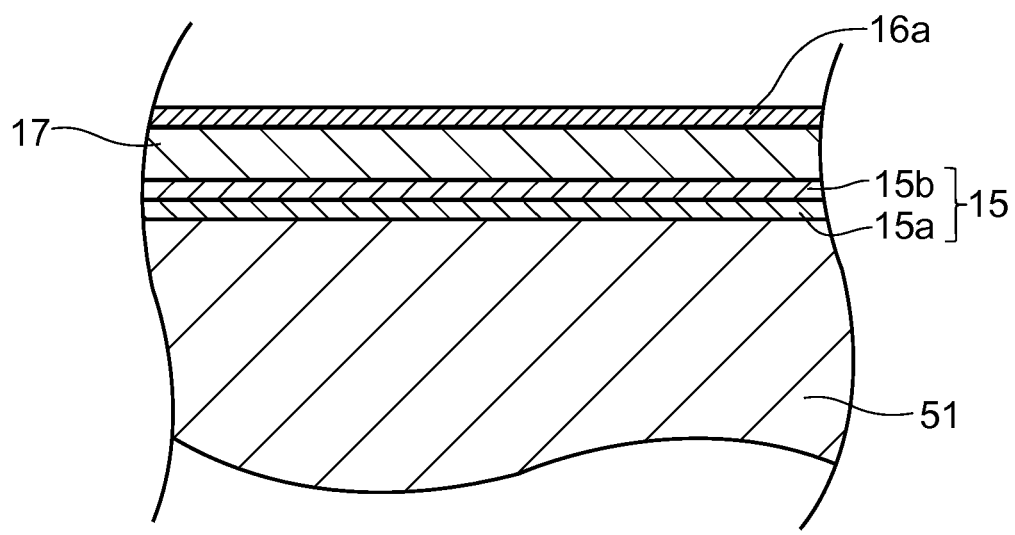
FIG. 12 is a sectional view showing a step of manufacturing the thin-film piezoelectric material element according to the embodiment of the present invention.
Figure 13:
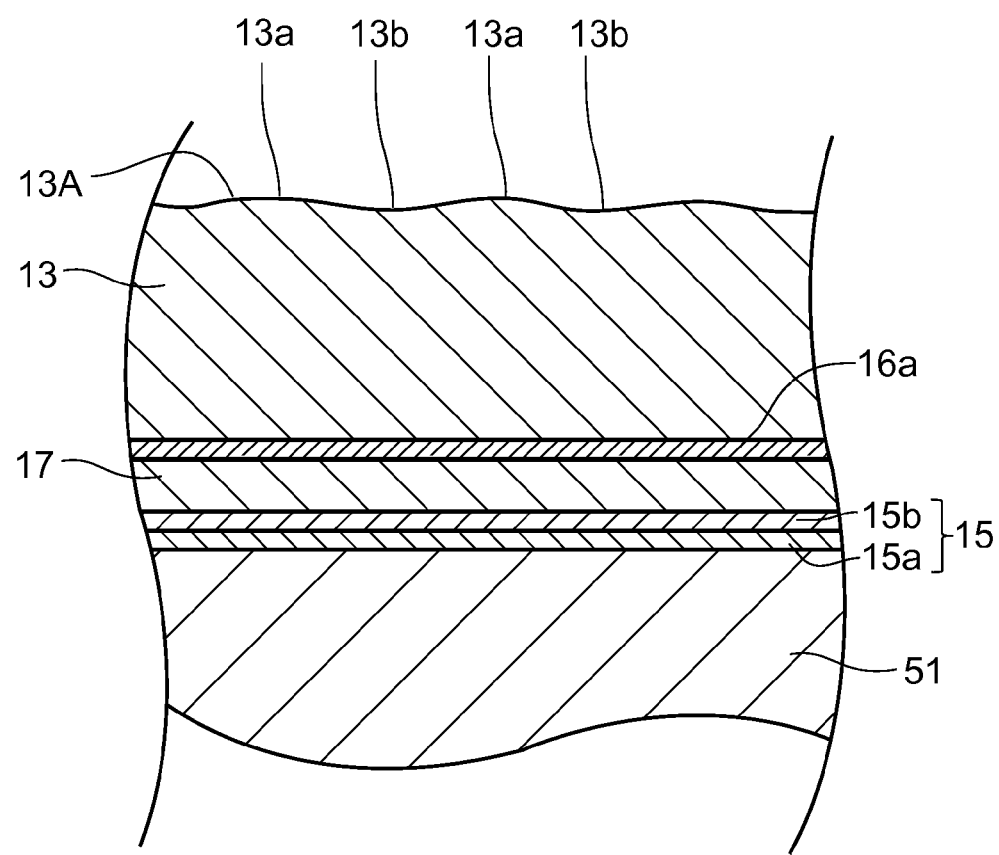
FIG. 13 is a sectional view showing a step subsequent to that of FIG. 12.
Figure 14:
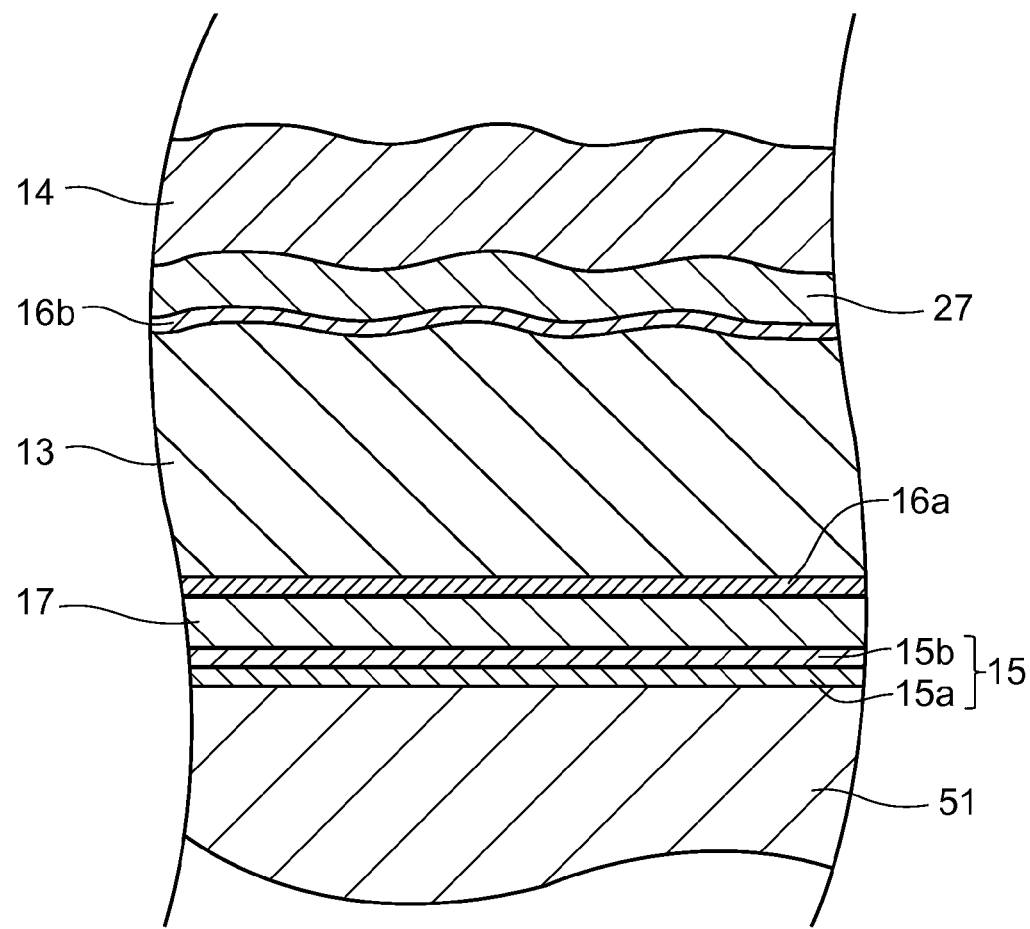
FIG. 14 is a sectional view showing a step subsequent to that of FIG. 13.

Subsequently, a method of manufacturing the thin-film piezoelectric material element 12b will now be explained with reference to FIGS. 9 (A) and 9 (B), FIGS. 10 (A) and 10 (B), FIG. 12 to FIG. 14. The thin-film piezoelectric material element 12b (similar to the thin-film piezoelectric material element 12a) is manufactured as following.

First, a substrate 51 made of Si (thickness of the substrate is about 100 μm to 3000 μm) is prepared, and epitaxial growth of a metal oxide thin-film such as $ZrO_2$ or the like is performed to formed the ground film 15 on the upper surface of the substrate 51. The ground film 15 is able to be formed as single layer, and it is able to be formed as a pile of a plurality of layers, as illustrated in FIG. 12. It is possible that $ZrO_2$ film, rare earth elements oxide film made of rare earth elements including yttrium, and oxygen, mixture or laminated film of them are preferably able to be used as the ground film 15.

Subsequently, a lower electrode film forming step is performed. In this step, epitaxial growth of metal element which has Pt as a main ingredient is performed on the ground film 15 by sputtering. This epitaxial growth makes the lower electrode film 17. Next, a lower adhesive film forming step is performed. In this step, the lower adhesive film 16a is formed with SRO for example, on upper surface of the lower electrode film 17 by sputtering.

After that, a piezoelectric material film forming step is performed. In this step, as illustrated in FIG. 13, epitaxial growth of piezoelectric material such as PZT or the like is performed on the lower adhesive film 16a by sputtering. On that occasion, the piezoelectric material film 13 is formed so that the surface of the piezoelectric material has roughness and the upper surface becomes the above-described concavity and convexity surface 13A, by controlling first deposition parameters.

Here, first deposition parameters are various parameters being adjusted when deposition of the piezoelectric material film 13 is performed by sputtering, and they have at least deposition rate, substrate temperature, gas pressure and gas composition. Numerical values of first deposition parameters, when the concavity and convexity surface 13A is formed, are able to be a first piezoelectric material deposition condition.

The present inventor discovers that a PZT film is formed in accordance with composition of numerical values selected appropriately from the later-described first piezoelectric material deposition condition to appear desired roughness in the upper surface, thereby the concavity and convexity surface 13A is formed, when epitaxial growth of the PZT film by sputtering is performed on the epitaxial film which the above-described ground film, lower electrode film and lower adhesive film are piled up on a silicon substrate, as a result of the various experiments.

First Piezoelectric Material Deposition Condition
deposition rate is about 0.1 to 3 μm/h, substrate temperature is about 350 to 750° C., gas pressure is about 0.01 to 10 Pa, gas composition is a mixture gas of argon and oxygen which oxygen partial pressure is set about 1 to 10%.

Therefore, in the piezoelectric material film forming step, the piezoelectric material film 13 having the concavity and convexity surface 13A is able to be formed by controlling first deposition parameters so as to satisfy the first piezoelectric material deposition condition. In general, when substrate temperature is increased, the surface becomes rough to extend sizes of convex part and concave part easily, when substrate temperature is decreased, the sizes of convex part and concave part tend to small to be flatten the surface. The present inventor discovered the above-described first piezoelectric material deposition condition, as a result of the various experiments in view of the above.

Further, the piezoelectric material film forming step is also able to be performed as follows. In this case, epitaxial growth of piezoelectric material such as PZT or the like is performed on the lower adhesive film 16a by sol-gel method. On that occasion, second deposition parameters are controlled to form the piezoelectric material film 13 having the concavity and convexity surface 13A.

Second deposition parameters are various parameters which are adjusted when deposition of the piezoelectric material film 13 is performed by sol-gel method, and they have at least the number of rotations of spin-coating, drying temperature, prebake temperature and oxygen pressure and temperature of a pressure anneal. Numerical values of second deposition parameters, when the concavity and convexity surface 13A is formed, are able to be a second piezoelectric material deposition condition.

The present inventor discovers that the PZT film is formed in accordance with composition of conditions selected appropriately from the later-described second piezoelectric material deposition condition to appear desired roughness in the upper surface, thereby the concavity and convexity surface 13A is formed, when epitaxial growth of the PZT film by sol-gel method is performed on the epitaxial film which the above-described ground film, lower electrode film and lower adhesive film are piled up on a silicon substrate, as a result of the various experiments.

Second Piezoelectric Material Deposition Condition
number of rotations of spin-coating is about 3000 to 5000 rpm, drying temperature is about 200 to 300° C. (in oxygen), prebake temperature is about 400 to 500° C. (in oxygen), oxygen pressure and temperature of a pressure anneal is 3 to 10 atmospheric pressure and 600 to 800° C.

Subsequently, an upper adhesive film forming step is performed. In this step, the upper adhesive film 16b is formed with SRO for example, on the concavity and convexity surface 13A of the piezoelectric material film 13 by sputtering, as illustrated in FIG. 14.

As explained later, the upper electrode film 27 and the stress balancing film 14 are formed in the order on the upper adhesive film 16b in later step. In this embodiment, the upper adhesive film forming step, the upper electrode film forming step and the stress balancing film forming step are performed as following so that the upper adhesive film 16b has the concavity and convexity structure similar to the concavity and convexity surface 13A, and the upper electrode film 27 has also the concavity and convexity structure similar to the concavity and convexity surface 13A. Namely, film thicknesses of the upper adhesive film 16b, the upper electrode film 27 and the stress balancing film 14 are set several % (about 1 to 3%) of film thickness of the piezoelectric material film 13, further film thicknesses of these films are decreased in order near to the piezoelectric material film 13, namely in order of the stress balancing film 14, the upper electrode film 27 and the upper adhesive film 16b.

In this case, film thicknesses of the upper electrode film 27 and the upper adhesive film 16b become extreme minute thickness which is extremely small than that of the piezoelectric material film 13. Thus, because at least half part of the upper adhesive film 16b from the lower surface to the upper surface may enter the concave part 13b, the concavity and convexity structure of the concavity and convexity surface 13A remains on the upper surface after the upper adhesive film 16b is formed, so the upper surface does not become flat. Further, the concavity and convexity structure of the concavity and convexity surface 13A remains on the upper surface after the upper electrode film 27 is formed.

Two layers of the upper adhesive film 16b and the upper electrode film 27, which are formed before the stress balancing film 14, are formed with small thickness than the stress balancing film 14. Therefore, clear concavity and convexity structure appear on the surface (upper surface of the upper electrode film 27) after these two layers are formed on the concavity and convexity surface 13A. Accordingly, as explained later, the compressive stress originated in the growth of crystal grains is generated in the stress balancing film 14.

Further, in the upper electrode film forming step, a growth of metal material having Pt as main ingredient is performed on the upper adhesive film 16b by sputtering to form the upper electrode film 27. The upper electrode film is not epitaxial growth film, it is a no-oriented polycrystal film or a preferentially oriented film with the (110) plane, or (111) plane.

As mentioned above, the lower adhesive film forming step and the upper adhesive film forming step are performed, thereby the piezoelectric material film 13 and the upper electrode film 27 are formed respectively on the lower electrode film 17, the piezoelectric material film 13 via the lower adhesive film 16a, the upper adhesive film 16b respectively.

After that, the stress balancing film forming step is performed. In this step, the stress balancing film 14 is formed with alloy material (for example, alloy material including Fe, Co and Mo) having iron (Fe) as main ingredient, by sputtering. Thereby, the thin-film piezoelectric material element 12b is obtained.

Note that the thin-film piezoelectric material element 12b is manufactured with the substrate 51, the substrate 51 is removed together with the ground film 15 by polishing or etching. Then a protective film made of polyimide and so on is formed, if necessary. And after a terminal is formed, the thin-film piezoelectric material elements 12a, 12b are adhered on a part which will become the tongue part 19 afterward using epoxy resin.

Here, a condition, which the upper electrode film 27 is formed on the piezoelectric material film 13 in the upper electrode film forming step, will be explained with reference to FIGS. 9 (A) and 9 (B) and FIGS. 10 (A) and 10 (B), as following. Note that an illustration of the upper adhesive film 16b is omitted in FIGS. 9 (A) and 9 (B) and FIGS. 10 (A) and 10 (B).

Figure 9:
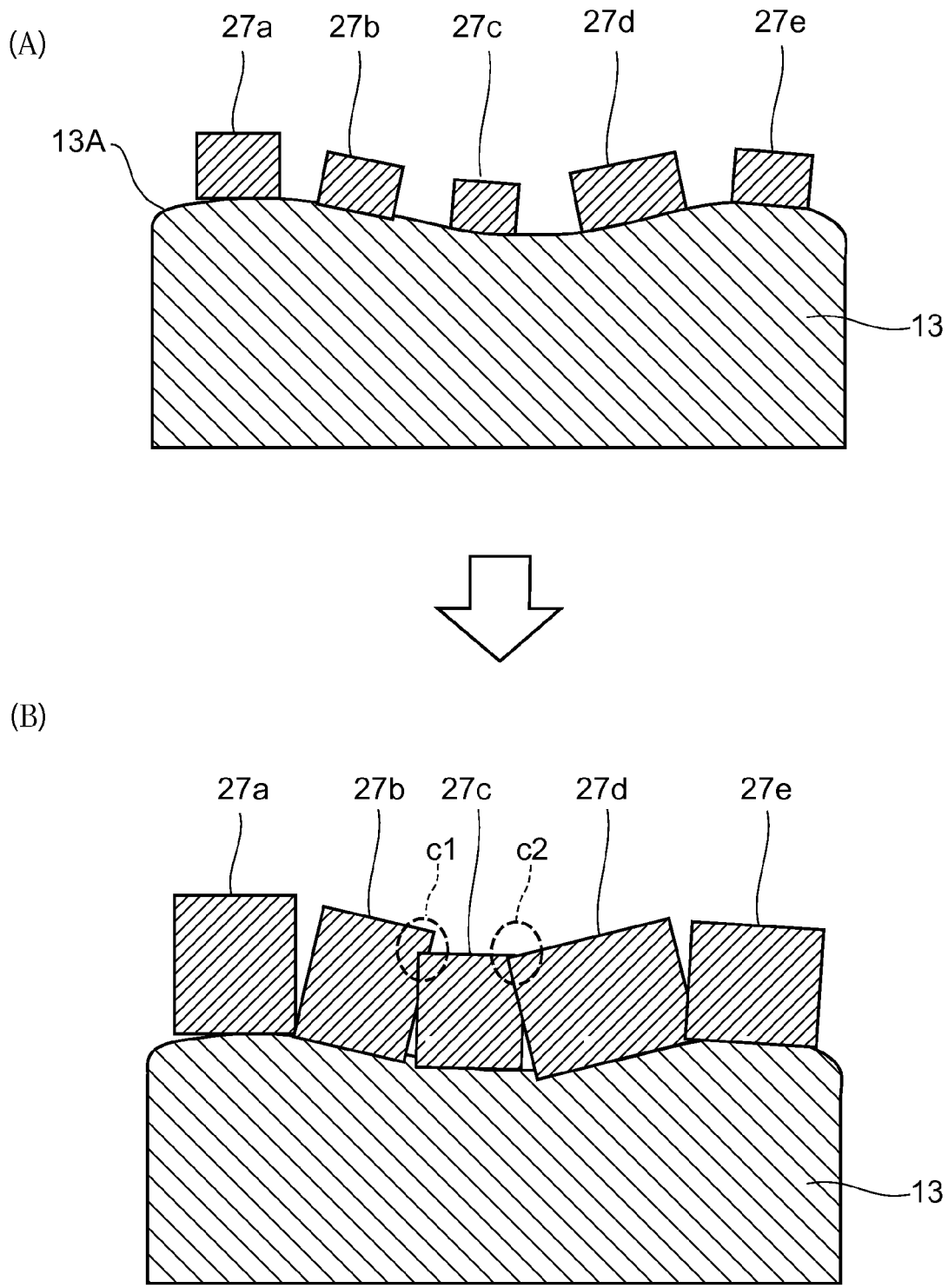
FIG. 9 is a sectional view in which (A) is schematically showing a state which an upper electrode film is formed on the piezoelectric material film and (B) is a sectional view showing a step subsequent to that of (A)

To begin with, as illustrated in FIG. 9 (A), a plurality of crystal grains 27a, 27b, 27c, 27d, 27e for deposition of the upper electrode film 27 are formed on the concavity and convexity surface 13A After that, these crystal grains 27a, 27b, 27c, 27d, 27e grow. In this case, because the concavity and convexity surface 13A has the concavity and convexity structure, directions of growth of each crystal grain 27a, 27b, 27c, 27d, 27e do not become same direction. Therefore, as illustrated in FIG. 9 (B), parts of the adjacent crystal grains begin contact caused by their growth. For example, as illustrated in FIG. 9 (B), the crystal grain 27b, crystal grain 27c, and crystal grain 27c, crystal grain 27d contact on part c1, part c2, respectively.

Further, each crystal grain 27a, 27b, 27c, 27d, 27e continues the growth, as illustrated in FIG. 10 (A), repulsion force operates in the crystal grains (near grain boundary) which touch each other. The repulsion force trys to keep the crystal grains away. Then, the repulsion force operates so as to extend the upper electrode film 27 outward, as illustrated in FIG. 10 (B). Therefore, this repulsion force appears as compressive stresses f1, f2 in the whole of the upper electrode film 27.

The upper electrode film 27 has such compressive stresses f1, f2. Compressive stresses f1, f2 operate on the direction which curves the upper electrode film 27 upward.

Further, as explained above, because the upper electrode film 27 being formed in this way has also the concavity and convexity structure similar to the concavity and convexity surface 13A, compressive stress F14b similar to compressive stresses f1, f2 is generated in the stress balancing film 14. This compressive stress F14b is the stress originated in the growth of crystal grains of the stress balancing film 14.

(Operation and Effect of Thin-Film Piezoelectric Material Element)

As mentioned above, because the thin-film piezoelectric material element 12b has the piezoelectric material film 13 and the stress balancing film 14, the thin-film piezoelectric material element 12b has the following operation and effect. Namely, the upper adhesive film 16b is formed on the concavity and convexity surface 13A of the piezoelectric material film 13. But, film thickness of the upper adhesive film 16b is minute thickness, the upper surface is a concavity and convexity surface similar to the concavity and convexity surface 13A. Therefore, the upper electrode film 27 formed on the upper adhesive film 16b has internal stress being compressive stress.

Further, because the upper surface of the upper electrode film 27 is also the concavity and convexity surface similar to the concavity and convexity surface 13A, the stress balancing film 14 has also the stress F14b being compressive stress. The stress balancing film 14 has internal stress including the stress F14b, originated in growth of crystal grains on a film having the concavity and convexity structure, and the stress F14a originated in the material, and it generates strong stress more than the thin-film which has only the stress F14a originated in the material. Because balance between the element stress F12 and the internal stress F14 is secured due to the formation of the stress balancing film 14 on the upper electrode film 27, the thin-film piezoelectric material element 12b has highly improved stress balancing operation more than the conventional one. By this, balance of stress along to the thickness direction inside of the element is surely secured in the thin-film piezoelectric material element 12b.

In a condition which the only element stress F12 operates, the thin-film piezoelectric material element 12b has curved in a direction which the element stress F12 operates. But, the internal stress F14 operates in addition to the element stress F12, balance of the both stresses is surely secured in the thin-film piezoelectric material element 12b. Therefore, the curve of the thin-film piezoelectric material element 12b is suppressed sufficiently. As explained above, though the thin-film piezoelectric material element 12b is a piezoelectric laminated material having a single layer, the curve of thin-film piezoelectric material element 12b is suppressed sufficiently in spite of a condition which voltage is not applied, and crooked displacement is also able to be suppressed. Therefore, thin-film piezoelectric material element 12b is suitable for the HGA.

Because crystal structure of the stress balancing film 14 is body-centered cubic structure, the stress balancing film 14 generates a large compressive stress in spite of small film thickness. Crystal structure of the upper electrode film 27 is face-centered cubic structure, the upper electrode film 27 generates compressive stress near the boundary to the stress balancing film 14. Further, these crystal structure are different, crack and so on by external force is hardly to occur. Therefore, the thin-film piezoelectric material element 12b has high-degree reliability.

Further, because the thin-film piezoelectric material element 12b has the lower adhesive film 16a and the upper adhesive film 16b, adhesive strength of the lower electrode film 17, the piezoelectric material film 13 and the upper electrode film 27 has been elevated. Furthermore, the concavity and convexity surface 13A of the piezoelectric material film 13 has the concavity and convexity structure, the upper adhesive film 16b and the upper electrode film 27 have also concavity and convexity structure similar to this one. Then, because a contact area with another film is extended than the case each film is flat, adhesive strength between each film has been more elevated.

Further, because a plurality of laminated materials, piled up on the substrate in the manufacturing process, do not need adhesion in the thin-film piezoelectric material element 12b, step for positioning of laminated material is not needed in the manufacturing process. Therefore, manufacturing process is able to be simplified, manufacturing cost is able to be reduced according to the above, in the thin-film piezoelectric material element 12b. Accordingly, the thin-film piezoelectric material element 12b is able to be manufactured without loss of mass production capability and cost decreasing effect.

Further, because adhesion about adhesive layers is not needed, adhesive layer is not likely to peel off each other and is not likely to form a gap or crack. Element reliability is improved according to the above.

And, in case the convex part 13a and concave part 13b of the concavity and convexity surface 13A have the meandering structure, contact area between the upper adhesive film 16b and the concavity and convexity surface 13A is enlarged. Thereby, adhesive strength of the piezoelectric material film 13 and the upper adhesive film 16b has been more improved, and reliability has been improved. Further, because the piezoelectric material film 13 is formed by epitaxial growth, the piezoelectric material film 13 is a film not having grain boundary, and it has good piezoelectric characteristic.

(Modified Example 1)

In case of the above-described piezoelectric material film 13, as illustrated in FIG. 8, the convex part 13a and concave part 13b have the meandering structure though, as illustrated in FIG. 21(A), it is possible that the convex part 13a and concave part 13b are formed by mostly straight line-shaped.

Further, as illustrated in FIG. 21(B), it is possible that the piezoelectric material film 13 has a plurality of meandering band shaped parts 13v1, 13v2, 13v3, 13v4 which convex parts and concave parts are arranged one after the other along the longitudinal direction.

Modified Example 2

Figure 22:
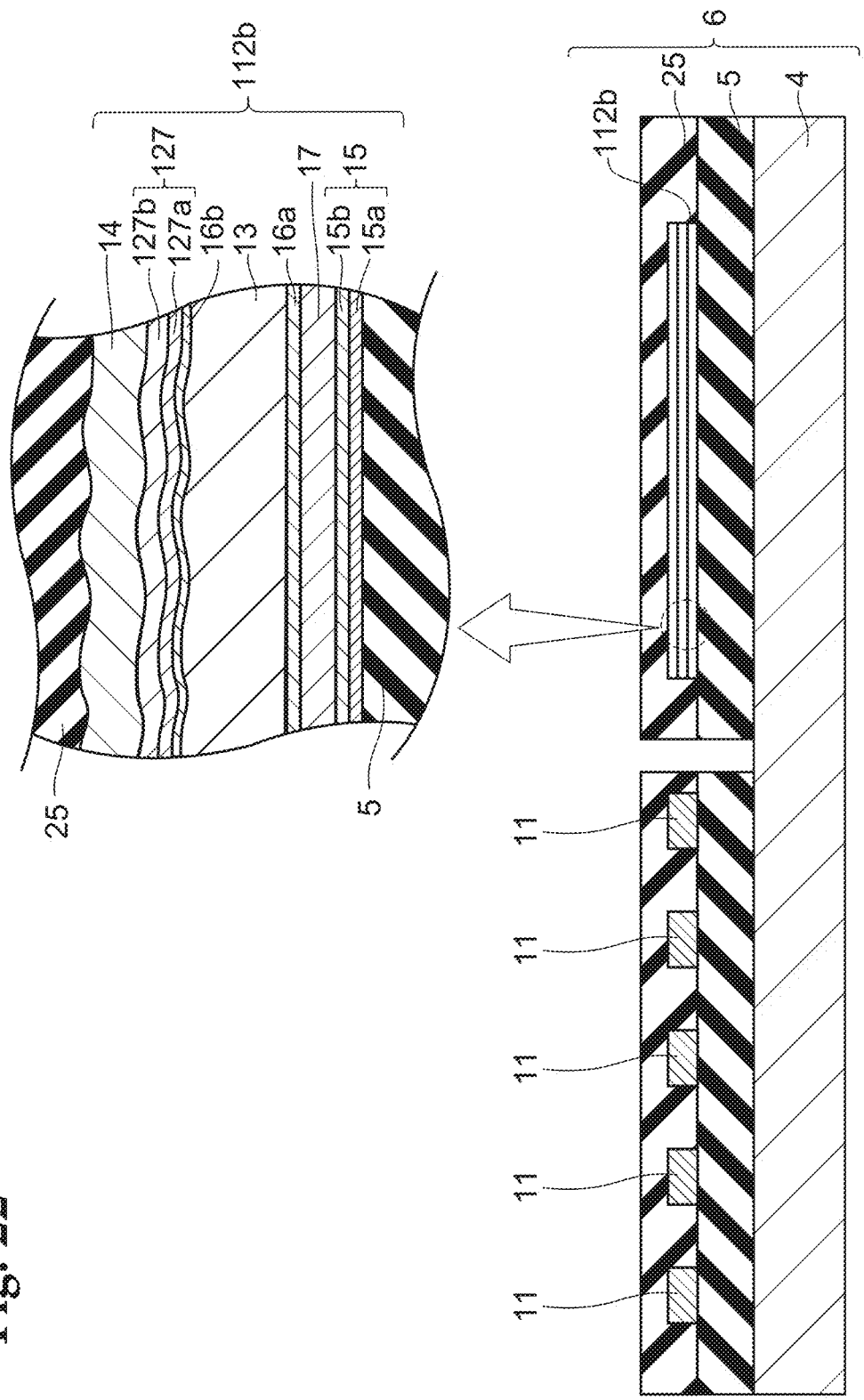
FIG. 22 is a sectional view, similar with FIG. 5, showing a part of flexure which the thin-film piezoelectric material element according to a modified example of the present invention is fixed.
Figure 23:
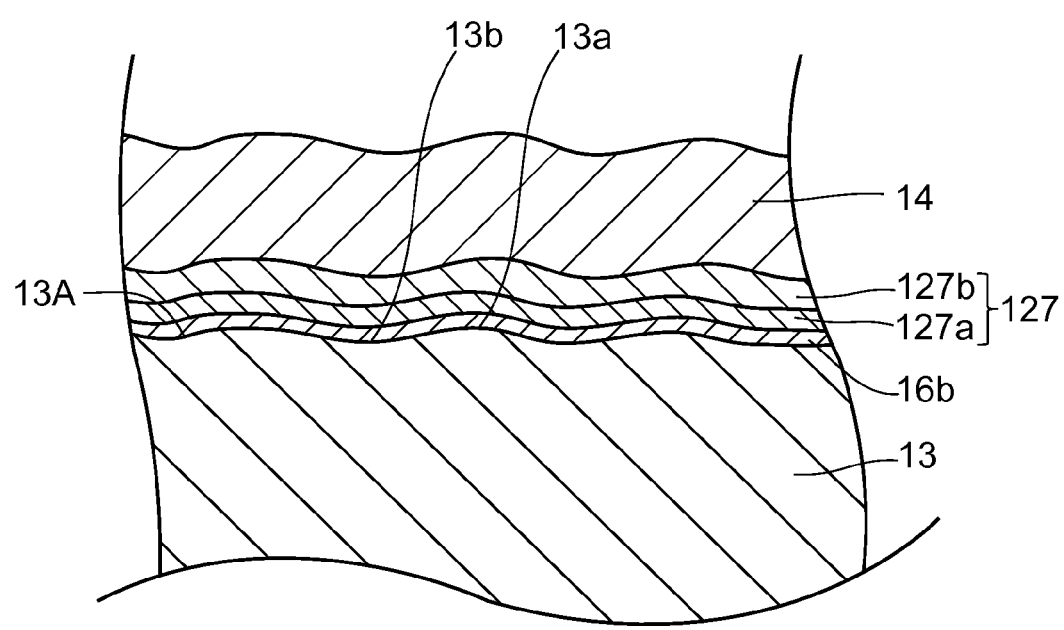
FIG. 23 is a sectional view showing a part of the thin-film piezoelectric material element with enlargement according to a modified example from the piezoelectric material film to the stress balancing film.

Subsequently, a thin-film piezoelectric material element 112b according to the modified example will be explained with reference to FIG. 22 to FIGS. 24 (A) and 24 (B). FIG. 22 is a sectional view, similar with FIG. 5, showing a part of the flexure 6 which the thin-film piezoelectric material element 112b according to a modified example is fixed. FIG. 23 is a sectional view showing a part of the thin-film piezoelectric material element 112b with enlargement from the piezoelectric material film 13 to the stress balancing film 14. FIG. 24 (A) is a sectional view, similar with FIG. 6, showing a principal part of FIG. 23 with enlargement, (B) is a sectional view showing a principal part of (A) with enlargement.

The thin-film piezoelectric material element 112b is different in that it has an upper electrode film 127 in place of the upper electrode film 27, as compared with the above-described thin-film piezoelectric material element 12b. The upper electrode film 127 is different in that it has a first metal layer 127a and a second metal layer 127b, and it has two layers structure which the second metal layer 127b is formed on the first metal layer 127a, as compared with the upper electrode film 27.

The first metal layer 127a is formed with the precious metals (for example Pt) which is main ingredient. The second metal layer 127b is formed with alloy material (for example, alloy material including Fe as a main ingredient) which has Young's modulus larger than the first metal layer 127a and not including the precious metals. As illustrated in FIG. 24 (B), the second metal layer 127b is formed so that the thickness tb is larger than the thickness to of the first metal layer 127a.

Further, the thin-film piezoelectric material element 112b is formed so that the precious metal which constitutes the lower electrode film 17 is the same with the precious metal which constitutes the first metal layer 127a. For example, both precious metals are able to be constituted with Pt as main ingredient. In the thin-film piezoelectric material element 112b, the lower electrode film 17 is formed as a (100) oriented film, having face-centered cubic structure, made of the precious metals such as Pt or the like as main ingredient.

Further, as illustrated in FIG. 24(A), the upper electrode film 127 has a film thickness which a part, from the lower surface (surface of the concavity and convexity surface 13A side) of the first metal layer 127a to the upper surface (surface of the stress balancing film 14 side) of the second metal layer 127b, is able to enter the concave part 13b, equal to the upper electrode film 27. Further, the upper surface of the second metal layer 127b is a concavity and convexity surface corresponding to the concavity and convexity surface 13A, the stress balancing film 14 is formed on the upper surface.

As mentioned above, in the thin-film piezoelectric material element 112b, the upper electrode film 127 has the two layers structure including the first, second metal layers 127a, 127b, and Young's modulus of metal material constituting the second metal layer 127b is larger than the Young's modulus of metal material constituting the first metal layer 127a. Therefore, curve of the upper electrode film 127 is effectively suppressed. In case of two layers structure made of material which Young's modulus of upper side (the stress balancing film 14 side) is larger than the lower side as the upper electrode film 127, internal stress which becomes compressive stress is enhanced more than the single layer as the upper electrode film 27. Furthermore, because the thickness tb of the second metal layer 127b is larger than the thickness to of the first metal layer 127a, internal stress is more strengthen. Therefore, the upper electrode film 127 suppresses the curve of the thin-film piezoelectric material element 112b powerfully. Accordingly, the stress balancing operation of the thin-film piezoelectric material element 112b is better than the thin-film piezoelectric material element 12b by having the upper electrode film 127.

Further, because upper surface of the upper electrode film 127 is a concavity and convexity surface similar to the upper electrode film 27, the stress balancing film 14 has stress F14b originated in growth of crystal grains in addition to the stress F14a originated in the material, thereby it generates strong stress. Accordingly, stress balance inside the element along to the thickness direction is surely secured in the thin-film piezoelectric material element 112b, than the thin-film piezoelectric material element 12b.

Crystal structure of the upper electrode film 127 is face-centered cubic structure, and it is different from the crystal structure of the stress balancing film 14. Therefore, crack is not likely to occur from the stress balancing film 14 to the upper electrode film 127 when it receives outer force, thereby reliability of the thin-film piezoelectric material element 112b is improved.

Further, because the lower electrode film 17 is formed as (100) oriented film having face-centered cubic structure made of precious metals such as Pt or the like as main ingredient, a compressive stress is generated effectively, on the upper surface of the piezoelectric material film 13 side.

Example

Present inventors form the piezoelectric material film 13 according to the-above described piezoelectric material deposition condition, after that, they form the stress balancing film 14 using alloy material including Fe, Co and Mo, thereby they form the thin-film piezoelectric material element 12b. As a result, curve of the element is decreased largely, and crooked displacement along to the thickness direction is able to be suppressed. Further, they form the thin-film piezoelectric material element not having the stress balancing film 14, they compared displacements (stroke sensitivities) per unit voltage along the longitudinal direction between both the thin-film piezoelectric material element, it is able to be confirmed that the stroke sensitivity of the former (the thin-film piezoelectric material element 12b having the stress balancing film 14) is improved about 40% than the stroke sensitivity of the latter.

Further, as a result of the X-ray Diffraction (XRD) measure, it is confirmed that lower electrode film made of Pt as main ingredient, lower adhesive film made of SRO and so on, and piezoelectric material film made of PZT and so on make epitaxial growth. The lower electrode film is a (100) oriented epitaxial film which (100) surface having face-centered cubic structure is oriented normal direction of film surface. Stress balancing film made of FeCoMo is a (110) oriented polycrystal film which (110) surface having body-centered cubic structure is oriented normal direction of film surface.

(Embodiments of Head Gimbal Assembly and Hard Disk Drive)

Next, embodiments of the head gimbal assembly and hard disk drive will now be explained with reference to FIG. 25.

Figure 25:
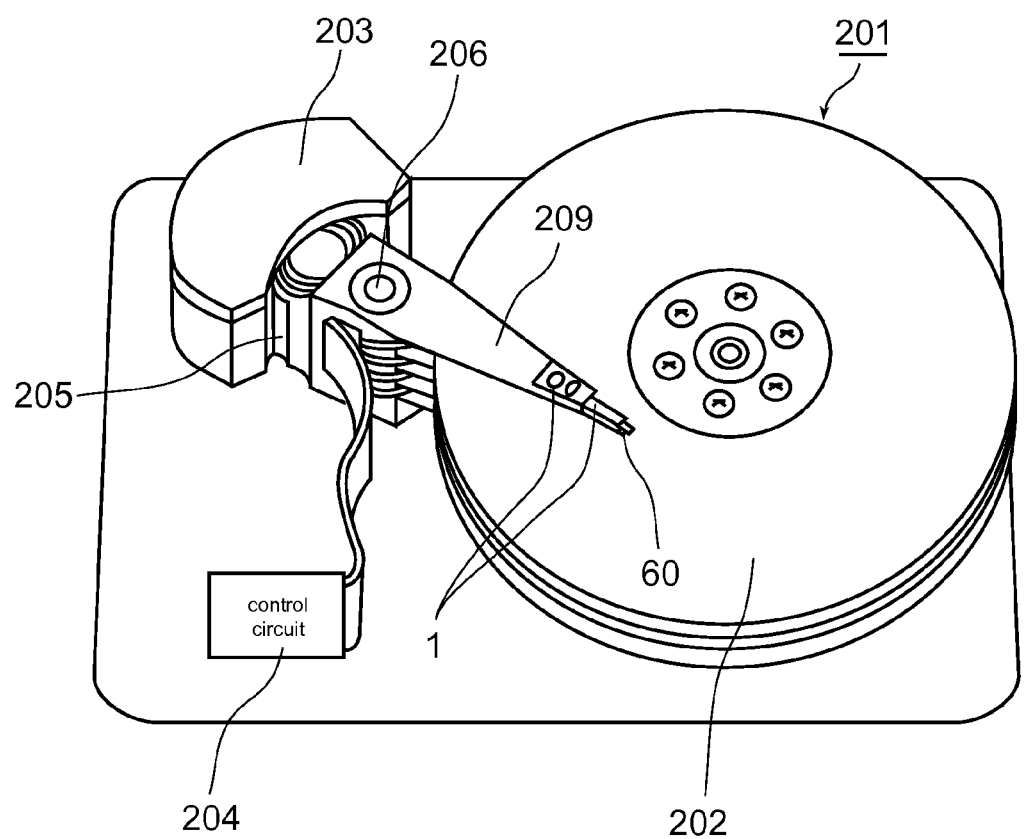
FIG. 25 is a perspective view illustrating a hard disk drive equipped with the HGA according to an embodiment of the present invention.

FIG. 25 is a perspective view illustrating a hard disk drive 201 equipped with the above-mentioned HGA 1. The hard disk drive 201 includes a hard disk (magnetic recording medium) 202 rotating at a high speed and the HGA 1. The hard disk drive 201 is an apparatus which actuates the HGA 1, so as to record/reproduce data onto/from recording surfaces of the hard disk 202. The hard disk 202 has a plurality of (4 in the drawing) platters. Each platter has a recording surface opposing its corresponding the head slider 60.

The hard disk drive 201 positions the head slider 60 on a track by an assembly carriage device 203. A thin-film magnetic head, not illustrated, is formed on this head slider 60. Further, the hard disk drive 201 has a plurality of drive arms 209. The drive arms 209 pivot about a pivot bearing shaft 206 by means of a voice coil motor (VCM) 205, and are stacked in a direction along the pivot bearing shaft 206. Further, the HGA 1 is attached to the tip of each drive arm 209.

Further, the hard disk drive 201 has a control circuit 204 controlling recording/reproducing.

In the hard disk drive 201, when the HGA 210 is rotated, the head slider 60 moves in a radial direction of the hard disk 202, i.e., a direction traversing track lines.

In case such HGA 1 and hard disk drive 201 are formed with the above-described thin-film piezoelectric material elements 12a, 12b, because curves of the thin-film piezoelectric material elements 12a, 12b are suppressed, mounting of the thin-film piezoelectric material elements 12a, 12b (fixing to the base insulating layer 5) is easily performed. Further, because damage of the thin-film piezoelectric material elements 12a, 12b at the timing of mounting is suppressed, yield of manufacturing the HGA 1 and the hard disk drive 201 has been improved.

Further, because thin-film piezoelectric material elements 12a, 12b have high stroke sensitivity in spite of a single layer, they are able to generate displacement along the longitudinal direction efficiently in comparison with a case of using the conventional thin-film piezoelectric material element, and position of the thin-film magnetic head is able to be adjusted effectively. Furthermore, thin-film piezoelectric material elements 12a, 12b have high stress balancing operation to an extent of being able to suppress the crooked displacement surely, in spite of a single layer. Further, because adhesive strength of thin-films is high, the HGA1 and the hard disk drive 201 are able to be manufactured without loss of mass production capability and cost decreasing effect.

(Embodiments of Ink Jet Head)

Next, embodiments of the Ink Jet Head will now be explained with reference to FIG. 26.

Figure 26:
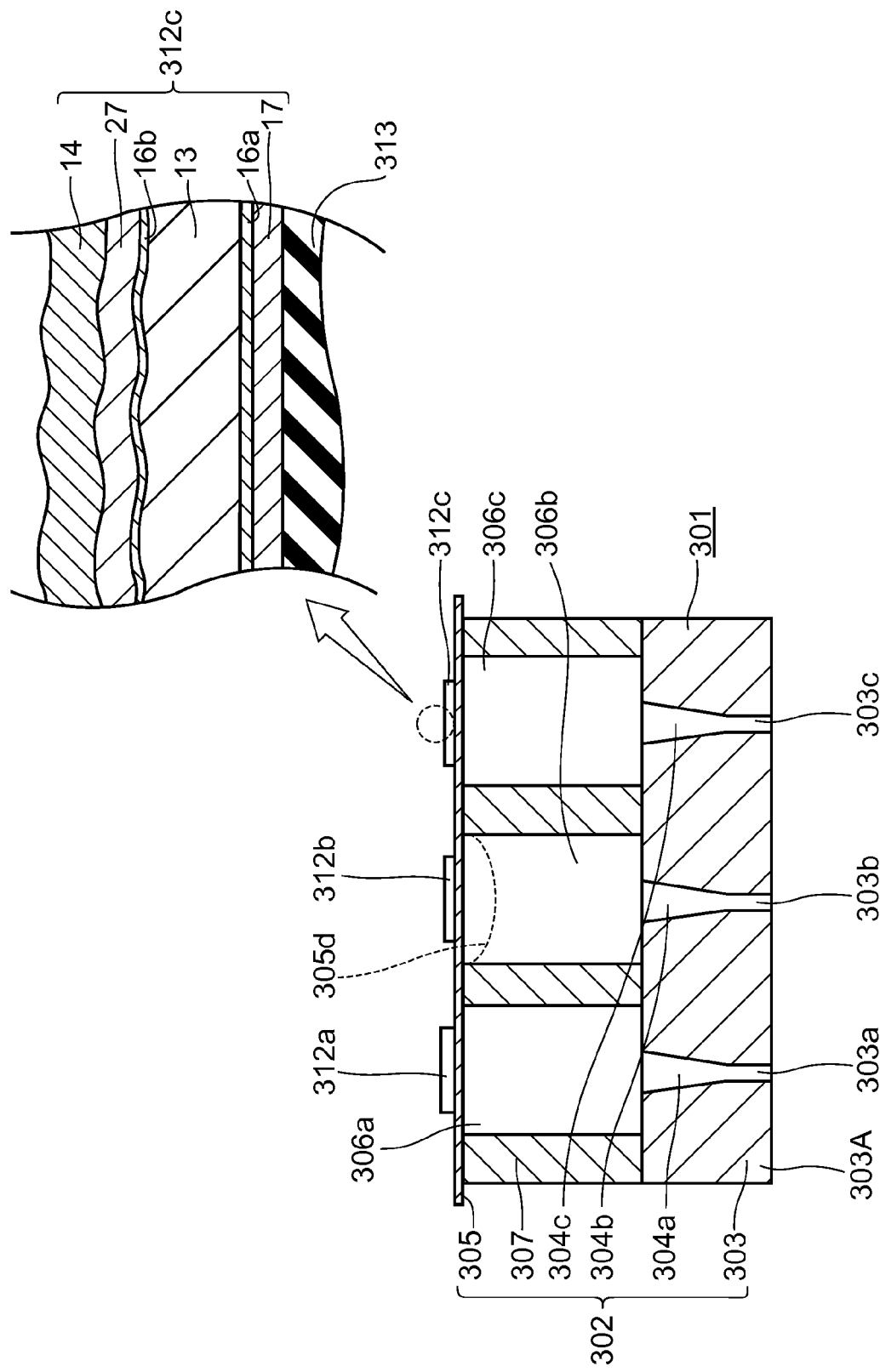
FIG. 26 is a sectional view showing a summary constitution of ink jet head according to the embodiment of the present invention.

FIG. 26 is a sectional view showing a summary constitution of the ink jet head 301. The ink jet head 301 is manufactured with thin-film piezoelectric material elements 312a, 312b, 312c. The ink jet head 301 has a head main body part 302 and thin-film piezoelectric material elements 312a, 312b, 312c.

The head main body part 302 has an ink passage structure body 303 and a vibration member 305.

The ink passage structure body 303 has a substrate 303A which a plurality of nozzles 303a, 303b, 303c and ink passages 304a, 304b, 304c (3 pieces in FIG. 26) and it has a structure which a plurality of ink chambers 306a, 306b, 306c are formed so as to correspond to the each nozzle 303a, 303b, 303c and the each ink passage 304a, 304b, 304c. Each ink chamber 306a, 306b, 306c is partitioned by a side wall part 307, and each of them communicates via nozzles 303a, 303b, 303c through ink passages 304a, 304b, 304c. Ink, not illustrated, is accommodated in each ink chamber 306a, 306b, 306c. The ink passage structure body 303 is able to be manufactured with a various kinds of material such as resin, metal, silicon (Si) substrate, glass substrate, ceramics or the like.

The vibration member 305 is adhered to the ink passage structure body 303 so as to cover a plurality of ink chambers 306a, 306b, 306c. The vibration member 305 is formed with silicon oxide (SiO) for example, and it has a thickness of about 3.5 µm. Then, thin-film piezoelectric material elements 312a, 312b, 312c are adhered to the outside of the vibration member 305 so as to correspond to the each ink chambers 306a, 306b, 306c. Thin-film piezoelectric material elements 312a, 312b, 312c are adhered to the vibration member 305 with adhesive 313.

The structure of each thin-film piezoelectric material element 312a, 312b, 312c is the same as the structure of the above-described thin-film piezoelectric material element 12b. Further, each thin-film piezoelectric material element 312a, 312b, 312c has not-illustrated electrode terminals. Not-illustrated wiring is connected to each electrode terminal.

The head main body part 302 and the ink jet head 301 are able to be manufactured as follows. To begin with, nozzles 303a, 303b, 303c and ink passages 304a, 304b, 304c are formed on the substrate 303A by machining. Next, the side wall part 307, which ink chambers 306a, 306b, 306c are formed by machining or etching, is adhered to the substrate 303A. Or the side wall part 307 is formed on the substrate 303A by plating. Then, the ink passage structure body 303 is manufactured. After that, the vibration member 305 is adhered to the ink passage structure body 303 to manufacture the head main body part 302.

Then, the substrate 51 is removed together with the above-described ground film 15 by polishing or etching, and thin-film piezoelectric material elements 312a, 312b, 312c are manufactured, further they are adhered to the vibration member 305 with adhesive 313 such as epoxy resin or the like. Then the ink jet head 301 is manufactured.

When electric power is supplied to thin-film piezoelectric material elements 312a, 312b, 312c via the wiring and electrode terminal from a not-illustrated power source concerning the ink jet head 301 manufactured as the above, as illustrated in FIG. 26, for example, transformation of the thin-film piezoelectric material elements 312b makes a curved part 305a in the vibration member 305. Then, the ink accommodated in each ink chamber 306a, 306b, 306c is pushed out, and the ink is ejected via ink passages 304a, 304b, 304c and nozzles 303a, 303b, 303c.

Because curves of the thin-film piezoelectric material elements 312a, 312b, 312c are suppressed equal to the above-described thin-film piezoelectric material elements 12b, adhering of thin-film piezoelectric material elements 312a, 312b, 312c to the vibration member 305 is easily performed. Further, because thin-film piezoelectric material element, manufactured on the substrate another from the head main body part 302, is adhered to the vibration member 305, thin-film piezoelectric material elements 312a, 312b, 312c are arranged efficiently. Furthermore, because limitation for material of the substrate 303A is reduced, manufacturing cost of the ink jet head 301 is able to be reduced than the conventional one.

Further, in the ink jet head 301, limitation for material of the head main body part 302 is reduced than a case which a lower electrode film, a piezoelectric material film and an upper electrode film are formed on a silicon substrate and ink passages and nozzles are formed on the silicon substrate by reactive ion etching or the like, so various kinds of material are able to be used for the head main body part 302. Therefore, the method with low cost than a processing such as reactive ion etching or the like is able to be used when the head main body part 302 is manufactured, the ink jet head 301 is manufactured easily. Further, nozzles and ink passages are formed respectively with another substrates, and nozzles and ink passages are joined together, after that, the thin-film piezoelectric material element is adhered to them, thereby the ink jet head is able to be manufactured, though they are not illustrated. In this case, nozzles are able to be formed by machining and ink passages are able to be formed by plating.

(Embodiments of Variable Focus Lens)

Next, embodiments of variable focus lens will now be explained with reference to FIG. 27, FIG. 28.

Figure 27:
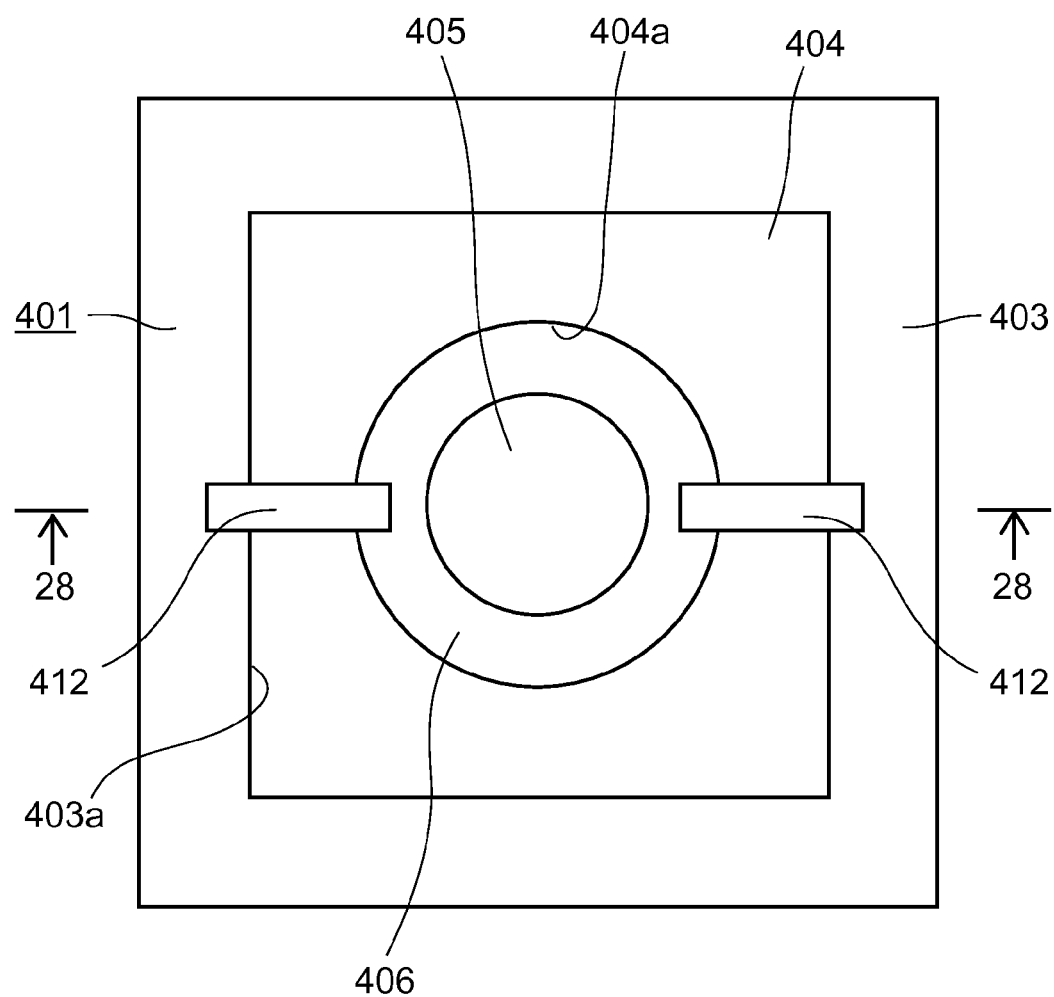
FIG. 27 is a plan view showing a summary constitution of variable focus lens according to the embodiment of the present invention.
Figure 28:
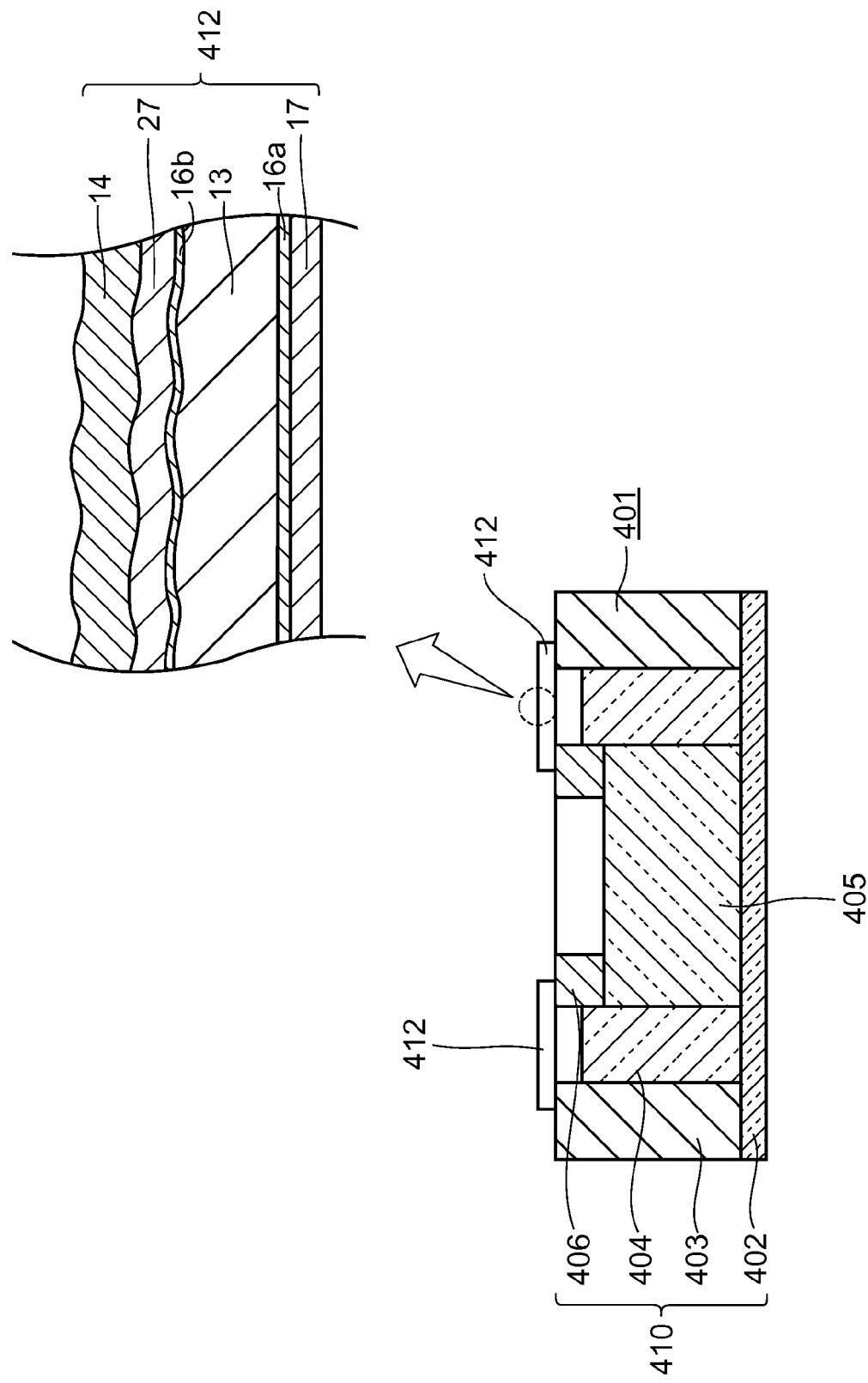
FIG. 28 is a sectional view taken along the line 28-28 in FIG. 27.

FIG. 27 is a plan view showing a summary constitution of variable focus lens 401 according to the embodiment. FIG. 28 is a sectional view taken along the line 28-28 in FIG. 27. The variable focus lens 401 has a lens main body part 410 and two thin-film piezoelectric material elements 412, 412.

The lens main body part 410 has a transparent substrate 402, a metal formed casing 403, a transparent elastic member 404, a transparent gel like resin 405 and a metal ring member 406.

The transparent substrate 402 is made of a transparent member such as glass or the like, and it is formed by a rectangular shape. The metal formed casing 403 is a pipe-shaped body, with a rectangular shape in a plan view, having a size corresponding to the transparent substrate 402, and a pipe-shaped gap part 403a is formed inside the metal formed casing 403. The metal formed casing 403 is formed with stainless for example. The transparent elastic member 404 is formed with a member, having a transparency and elasticity and being transformed easily, such as a transparent polymer or the like, and it fits to the pipe-shaped gap part 403a of the metal formed casing 403 without gap. Further, inside of the transparent elastic member 404 is a cylindrical gap part 404a. The transparent gel like resin 405 is made of silicone resin or the like, and it is accommodated in the cylindrical gap part 404a of the transparent elastic member 404. The transparent gel like resin 405 presents a cylindrical shape by fitting to the inside wall of the cylindrical gap part 404a without gap. The metal ring member 406 is a circular loop like member having a moderate thickness, and it is placed on the surface of the transparent gel like resin 405, in the cylindrical gap part 404a.

And, thin-film piezoelectric material elements 412a, 412b are bridged over the metal ring member 406 and the metal formed casing 403 across the transparent elastic member 404, and they are adhered to them with not-illustrated adhesive. Each thin-film piezoelectric material element 412, 412 is arranged on the straight line which passes through a center of the transparent gel like resin 405, so as to oppose each other intervening the center of the transparent gel like resin 405.

The structure of each thin-film piezoelectric material element 412, 412 is the same as the structure of the above-described thin-film piezoelectric material elements 12b. Further, each thin-film piezoelectric material element 412, 412 has not-illustrated electrode terminal. Not-illustrated wiring is connected to each electrode terminal.

The variable focus lens 401 having the above-described structure is manufactured as follows. To begin with, the substrate 51 is removed together with the above-described ground film 15 by polishing or etching, and thin-film piezoelectric material elements 412, 412 are manufactured. Further thin-film piezoelectric material elements 412, 412 are adhered to the lens main body part 410 with not-illustrated adhesive. Then, the variable focus lens 401 is manufactured.

When electric power is supplied to each thin-film piezoelectric material element 412, 412 via the wiring, concerning the above-described variable focus lens 401 manufactured as the above, each thin-film piezoelectric material element 412, 412 is transformed. The metal ring member 406 is pushed in accordance with the transformation, and thereby the transparent gel like resin 405 is transformed. In this way, the focus length of the variable focus lens 401 is able to be changed. Because curve of the thin-film piezoelectric material element 412 is suppressed equal to the above-described thin-film piezoelectric material elements 12b, adhering of thin-film piezoelectric material element 412 to the lens main body part 410 is easily performed.

(Modified Example of Variable Focus Lens)

Figure 29:
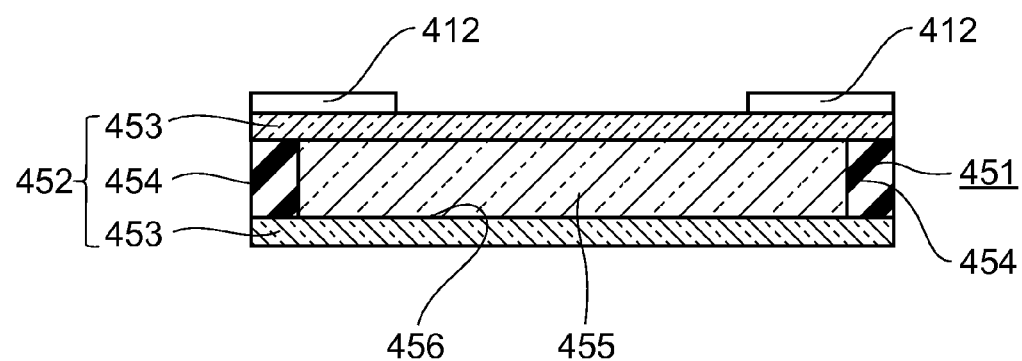
FIG. 29 is a sectional view showing a summary constitution of variable focus lens according to the modified example.

Next, modified example of variable focus lens will now be explained with reference to FIG. 29. FIG. 29 is a sectional view showing the summary constitution of the variable focus lens 451 according to the modified example. The variable focus lens 451 has the lens main body part 452 and thin-film piezoelectric material elements 412, 412.

The lens main body part 452 has the transparent glass substrate 453, 453, sealing resin member 454 and the transparent gel like resin 455.

The transparent glass substrates 453, 453 has a board like form having a thin thickness, and it has a moderate elasticity capable of being curved moderately. The transparent glass substrates 453, 453 are arranged so as to confront each other at predetermined interval. Sealing resin member 454 is adhered to the all surrounding of gap space between transparent glass substrates 453, 453. The sealed up space 456 is formed by the above-described transparent glass substrates 453, 453 and the sealing resin member 454, and the transparent gel like resin 455, equal to the transparent gel like resin 405, is accommodated in the sealed up space 456.

Then, thin-film piezoelectric material elements 412, 412 are adhered to the outside of the one of the transparent glass substrate 453, 453 using not-illustrated adhesive. These thin-film piezoelectric material elements 412 have not-illustrated electrode terminals equal to the above-described variable focus lens 401. Not-illustrated wiring is connected to the electrode terminals. When electric power is supplied to thin-film piezoelectric material elements 412, 412 via the wiring, thin-film piezoelectric material elements 412, 412 are transformed. The transformation makes a transformation (or a bending) of the transparent glass substrate 453, and thereby the transparent gel like resin 455 is transformed. In this way, focus length of the variable focus lens 451 is able to be changed. Because curves of the thin-film piezoelectric material elements 412, 412 in the variable focus lens 451 are also suppressed equal to the above-described thin-film piezoelectric material element 12b, adhering of thin-film piezoelectric material elements 412, 412 to the lens main body part 452 is easily performed.

(Embodiments of Pulse Wave Sensor)

Figure 30:
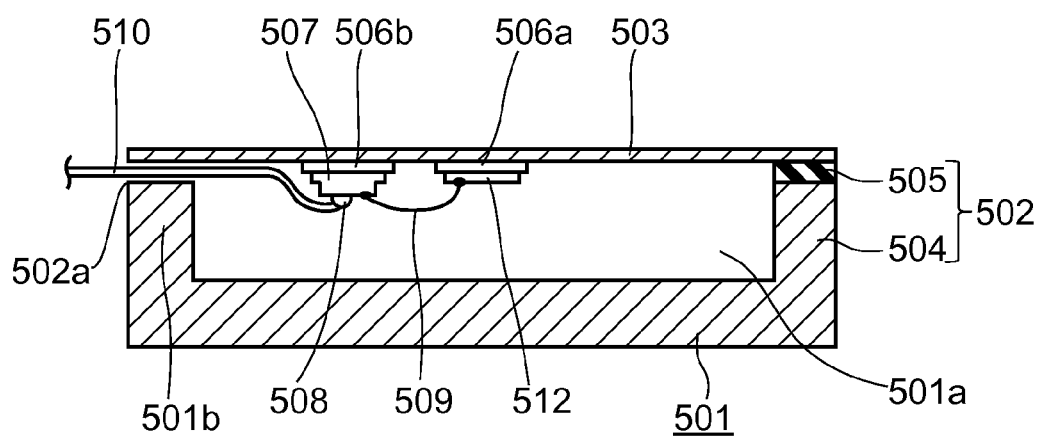
FIG. 30 is a sectional view showing a summary constitution of a pulse wave sensor according to the embodiment of the present invention.

Next, embodiments of pulse wave sensor will now be explained with reference to FIG. 30. FIG. 30 is a sectional view showing a summary constitution of the pulse wave sensor 501 according to the embodiment. The pulse wave sensor 501 has a sensor main body part 502 and a thin-film piezoelectric material element 512.

The sensor main body part 502 has a metal formed casing 504, a sealing member 505, a vibration plate 503 made of flexible member, metal pad 507, a wiring member 509 and a lead 510.

The metal formed casing 504 is formed with a metal such as aluminium, stainless or the like. The metal formed casing 504 is a cylindrical member with bottom, which a concavity part 501*a* is formed at a center, and a wall part 501*b* is formed so as to surround the concavity part 501*a*. The sealing member 505 is made of member having elasticity such as silicone resin or the like, and it is adhered to part between a wall part 501*b* of the metal formed casing 504 and the vibration plate 503. The vibration plate 503 is formed to be a circular plate shape, having of 10 mm diameter, and 0.1 mm thickness. The vibration plate 503 is formed with a metal such as stainless or the like so that it is able to be transformed.

The metal pad 507 is made of Au, Cr, Cu or the like, and it is adhered to the inside (the concavity part 501*a* side) of vibration plate 503, using adhesive 506*b* such as epoxy resin or the like. The metal pad 507 is connected to the thin-film piezoelectric material element 512 by a wiring member 509 made of Au or the like. Further, the metal pad 507 is also connected to the lead 510 by solder 508. The lead 510 is connected to the not-illustrated power source.

Then, the thin-film piezoelectric material element 512 is connected to the inside (the concavity part 501*a* side) of the vibration plate 503, using adhesive 506*a* such as epoxy resin or the like. The structure of the thin-film piezoelectric material element 512 is the same as the structure of the above-described thin-film piezoelectric material elements 12*b*. Further, the wiring member 509 is connected to the thin-film piezoelectric material element 512.

The above-described pulse wave sensor 501 is used as follows. The vibration plate 503 is brought into contact with the human body such as not-illustrated arm or the like. Then, the pulsation of the human body is transmitted to the vibration plate 503, and the vibration plate 503 is transformed. When the vibration plate 503 is transformed, the thin-film piezoelectric material element 512 is transformed in accordance with the transformation, and feeble electric signal (pulse wave signal), in accordance with the transformation, is outputted from the thin-film piezoelectric material element 512. The electric signal is outputted in the outside via the wiring member 509, the metal pad 507 and the lead 510. When the electric signal is amplified by the not-described amplifier, the wave form of the pulse wave signal is able to be observed. In this way, the pulse wave signal is able to be detected by the pulse wave sensor 501. Because curve of the thin-film piezoelectric material element 512 is suppressed equal to the above-described thin-film piezoelectric material element 12*b*, adhering of thin-film piezoelectric material element 512 to the vibration plate 503 is easily performed.

Note that though the pulse wave sensor is explained as the sensor by way of example in the above-described embodiment, the present invention is also applicable to various kinds of sensors such as a pressure sensor, vibration sensor, accelerometer and load sensor or the like.

Curve and crooked displacement become to be fully suppressed in spite of the piezoelectric laminated material having a single layer by applying the present invention, further, the thin-film piezoelectric material element, enhanced a adhesion strength of thin-film, is able to be manufactured without loss of mass production capability and cost decreasing effect. The present invention is able to be utilized for the thin-film piezoelectric material element, method of manufacturing the same, head gimbal assembly, hard disk drive, ink jet head, variable focus lens and sensor having the thin-film piezoelectric material element.

This invention is not limited to the foregoing embodiments but various changes and modifications of its components may be made without departing from the scope of the present invention. Besides, it is clear that various embodiments and modified examples of the present invention can be carried out on the basis of the foregoing explanation. Therefore, the present invention can be carried out in modes other than the above-mentioned best modes within the scope equivalent to the following claims.

What is claimed is:

1. A thin-film piezoelectric material element comprising:
   a lower electrode film;
   a piezoelectric material film; and
   an upper electrode film;
   wherein the lower electrode film, the piezoelectric material film and the upper electrode film are laminated sequentially;
   wherein the piezoelectric material film has an upper surface of the upper electrode film side, and the upper surface is a concavity and convexity surface having a convex part and a concave part, the convex part is a curved surface convexly projected from a center surface of the concavity and convexity surface along a height direction, and the concave part is a curved surface concavely hollowed from the center surface and connected to the convex part,
   wherein the upper electrode film is formed on the concavity and convexity surface,
   the thin-film piezoelectric material element comprising:
   a stress balancing film having an internal stress capable of cancelling an element stress which the lower electrode film, the piezoelectric material film and the upper electrode film curve convexly toward a direction from the upper electrode film to the lower electrode film,
   wherein the stress balancing film is formed on the upper electrode film so that a balance between the element stress and the internal stress is secured.

2. The thin-film piezoelectric material element according to claim 1, further comprising:
   an upper adhesive film formed on the concavity and convexity surface,
   wherein the upper adhesive film has a film thickness which at least half part from a lower surface of the concavity and convexity surface side to an upper surface of the stress balancing film side enter the concave part,
   wherein an upper surface of the upper adhesive film of the upper electrode film side is a concavity and convexity surface according to the concavity and convexity surface of the piezoelectric material film,
   wherein the upper electrode film is formed on the upper surface of the upper adhesive film.

3. The thin-film piezoelectric material element according to claim 2,
   wherein the upper electrode film has a film thickness which at least a part from a lower surface of the concavity and convexity surface side to a upper surface of the stress balancing film side enter the concave part,
   wherein the upper surface of the stress balancing film side of the upper electrode film is a concavity and convexity surface according to the concavity and convexity surface of the piezoelectric material film, the stress balancing film is formed on the upper surface of the upper electrode film.

4. The thin-film piezoelectric material element according to claim 1,
wherein the upper electrode film has a film thickness which at least a part from a lower surface of the concavity and convexity surface side to an upper surface of the stress balancing film side enter the concave part,
wherein the upper surface of the stress balancing film side of the upper electrode film is a concavity and convexity surface according to the concavity and convexity surface of the piezoelectric material film, the stress balancing film is formed on the upper surface of the upper electrode film.

5. The thin-film piezoelectric material element according to claim 1,
wherein the stress balancing film is formed with the alloy material which includes iron as the main ingredient,
wherein the stress balancing film has a compressive stress which is generated in the neighborhood of grain boundary by contact of adjacent crystal grains, of plurality of crystal grains being formed on the upper electrode film at the time of depositing, caused by their growth,
wherein the stress balancing film has the internal stress including the compressive stress. concavity and convexity surface of the piezoelectric material film, the stress balancing film is formed on the upper surface of the upper electrode film.

6. The thin-film piezoelectric material element according to claim 5,
wherein the stress balancing film has a gap part, whic is formed by mis-contact of adjacent crystal grains, between adjacent crystal grains.

7. The thin-film piezoelectric material element according to claim 1,
wherein the lower electrode film is formed as a (100) oriented film, having face-centered cubic structure, which includes the precious metals as the main ingredient,
wherein the upper electrode film includes a first metal layer formed on the concavity and convexity surface, a second metal layer formed on the first metal layer,
wherein the first metal layer is formed with the precious metals as the main ingredient,
wherein the second metal layer is formed with alloy material which has Young's modulus larger than the first metal layer and does not include the precious metals.

8. The thin-film piezoelectric material element according to claim 7,
wherein the precious metals which constitute the lower electrode film and the precious metal which constitute the first metal layer are constituted with the same element.

9. The thin-film piezoelectric material element according to claim 7,
wherein a thickness of the second metal layer is larger than a thickness of the first metal layer.

10. The thin-film piezoelectric material element according to claim 7,
wherein the upper electrode film has a film thickness which at least a part from a lower surface of the concavity and convexity surface side of the first metal layer to an upper surface of the stress balancing film side of the second metal layer enter the concave part,
wherein the upper surface of the stress balancing film side of the second metal layer is a concavity and convexity surface according to the concavity and convexity surface of the piezoelectric material film,
wherein the stress balancing film is formed on the upper surface of the second metal layer.

11. The thin-film piezoelectric material element according to claim 1, further comprising:
a lower adhesive film formed on an upper surface of the lower electrode film of the piezoelectric material film side, the piezoelectric material film is formed on the lower adhesive film.

12. The thin-film piezoelectric material element according to claim 1,
wherein film thicknesses of the stress balancing film and the upper electrode film are decreased in the order.

13. A method of manufacturing a thin-film piezoelectric material element comprising a lower electrode film; a piezoelectric material film; and an upper electrode film; wherein the lower electrode film, the piezoelectric material film and the upper electrode film are laminated sequentially; comprising:
a lower electrode film forming step of forming the lower electrode film on a substrate;
a piezoelectric material film forming step of forming the piezoelectric material film on the lower electrode film by sputtering, controlling deposition parameters, including deposition rate according to a deposition of the piezoelectric material, substrate temperature, gas pressure and gas composition, makes an upper surface, of the piezoelectric material film separated side from the substrate, a concavity and convexity surface includes a concave part and a convex part, the convex part is a curved surface convexly projected from a center surface along a height direction, and the concave part is a curved surface concavely hollowed from the center surface and connected to the convex part,
an upper electrode film forming step of forming the upper electrode film on the concavity and convexity surface;
a stress balancing film forming step of forming a stress balancing film, having an internal stress capable of cancelling an element stress which the lower electrode film, the piezoelectric material film and the upper electrode film curve convexly toward the substrate, on the upper electrode film.

14. The method of manufacturing a thin-film piezoelectric material element according to claim 13, further comprising:
a lower adhesive film forming step of forming a lower adhesive film on an upper surface of the lower electrode film separated side from the substrate,
an upper adhesive film forming step of forming an upper adhesive film on the concavity and convexity surface,
wherein the upper adhesive film forming step, the upper electrode film forming step and the stress balancing film forming step are performed in a manner that film thicknesses of the stress balancing film, the upper electrode film and the upper adhesive film are decreased in the order, and at least half part of the upper adhesive film, from a lower surface of the concavity and convexity surface side to an upper surface of the stress balancing film side, enter the concave part.

15. A method of manufacturing a thin-film piezoelectric material element comprising a lower electrode film; a piezoelectric material film; and an upper electrode film; wherein the lower electrode film, the piezoelectric material film and the upper electrode film are laminated sequentially; comprising:
a lower electrode film forming step of forming the lower electrode film on a substrate;
a piezoelectric material film forming step of forming the piezoelectric material film on the lower electrode film by sol-gel method, controlling deposition parameters, including number of rotations of spin-coating, drying temperature, prebake temperature, and oxygen pressure and temperature of a pressure anneal makes an upper surface, of the piezoelectric material film separated side from the substrate, a concavity and convexity surface includes a concave part and a convex part, the convex part is a curved surface convexly projected from a center surface along a height direction, and the concave part is a curved surface concavely hollowed from the center surface and connected to the convex part, an upper electrode film forming step of forming the upper electrode film on the concavity and convexity surface;

a stress balancing film forming step of forming a stress balancing film, having an internal stress capable of cancelling an element stress which the lower electrode film, the piezoelectric material film and the upper electrode film curve convexly toward the substrate, on the upper electrode film.

16. A head gimbal assembly comprising a head slider having a thin-film magnetic head; a suspension for supporting the head slider; and a thin-film piezoelectric material element for displacing the head slider relatively to the suspension;

wherein the thin-film piezoelectric material element comprising:

a lower electrode film;

a piezoelectric material film; and an upper electrode film;

wherein the lower electrode film, the piezoelectric material film and the upper electrode film are laminated sequentially;

wherein the piezoelectric material film has an upper surface of the upper electrode film side, and the upper surface is a concavity and convexity surface having a convex part and a concave part, the convex part is a curved surface convexly projected from a center surface of the concavity and convexity surface along a height direction, and the concave part is a curved surface concavely hollowed from the center surface and connected to the convex part, wherein the upper electrode film is formed on the concavity and convexity surface, the thin-film piezoelectric material element comprising:

a stress balancing film having an internal stress capable of cancelling an element stress which the lower electrode film, the piezoelectric material film and the upper electrode film curve convexly toward a direction from the upper electrode film to the lower electrode film, wherein the stress balancing film is formed on the upper electrode film so that a balance between the element stress and the internal stress is secured.

17. A hard disk drive comprising a head gimbal assembly including a head slider having a thin-film magnetic head, a suspension for supporting the head slider, a thin-film piezoelectric material element for displacing the head slider relatively to the suspension; and a recording medium;

wherein the thin-film piezoelectric material element comprising:

a lower electrode film;

a piezoelectric material film; and an upper electrode film;

wherein the lower electrode film, the piezoelectric material film and the upper electrode film are laminated sequentially;

wherein the piezoelectric material film has an upper surface of the upper electrode film side, and the upper surface is a concavity and convexity surface having a convex part and a concave part, the convex part is a curved surface convexly projected from a center surface of the concavity and convexity surface along a height direction, and the concave part is a curved surface concavely hollowed from the center surface and connected to the convex part, wherein the upper electrode film is formed on the concavity and convexity surface, the thin-film piezoelectric material element comprising:

a stress balancing film having an internal stress capable of cancelling an element stress which the lower electrode film, the piezoelectric material film and the upper electrode film curve convexly toward a direction from the upper electrode film to the lower electrode film, wherein the stress balancing film is formed on the upper electrode film so that a balance between the element stress and the internal stress is secured.

18. An ink jet head comprising a head main body part including a plurality of nozzles and a plurality of ink chambers which communicate via each the nozzle, a thin-film piezoelectric material element being formed corresponding to the each ink chamber of the head main body part, and which is transformed so as to push out ink accommodated in each the ink chamber in accordance with recording signal;

wherein the thin-film piezoelectric material element comprising:

a lower electrode film;

a piezoelectric material film; and an upper electrode film;

wherein the lower electrode film, the piezoelectric material film and the upper electrode film are laminated sequentially;

wherein the piezoelectric material film has an upper surface of the upper electrode film side, and the upper surface is a concavity and convexity surface having a convex part and a concave part, the convex part is a curved surface convexly projected from a center surface of the concavity and convexity surface along a height direction, and the concave part is a curved surface concavely hollowed from the center surface and connected to the convex part, wherein the upper electrode film is formed on the concavity and convexity surface, the thin-film piezoelectric material element comprising:

a stress balancing film having an internal stress capable of cancelling an element stress which the lower electrode film, the piezoelectric material film and the upper electrode film curve convexly toward a direction from the upper electrode film to the lower electrode film, wherein the stress balancing film is formed on the upper electrode film so that a balance between the element stress and the internal stress is secured.

19. A variable focus lens comprising a lens main body including a transparent substrate, a transparent resin accommodated the inside of the lens main body, a thin-film piezoelectric material element, for transforming the transparent resin, which is adhered to the lens main body;

wherein the thin-film piezoelectric material element comprising:

a lower electrode film;

a piezoelectric material film; and an upper electrode film;

wherein the lower electrode film, the piezoelectric material film and the upper electrode film are laminated sequentially;

wherein the piezoelectric material film has an upper surface of the upper electrode film side, and the upper surface is a concavity and convexity surface having a convex part and a concave part, the convex part is a curved surface convexly projected from a center surface of the concavity and convexity surface along a height direction, and the concave part is a curved surface concavely hollowed from the center surface and connected to the convex part, wherein the upper electrode film is formed on the concavity and convexity surface, the thin-film piezoelectric material element comprising:

a stress balancing film having an internal stress capable of cancelling an element stress which the lower electrode film, the piezoelectric material film and the upper electrode film curve convexly toward a direction from the upper electrode film to the lower electrode film, wherein the stress balancing film is formed on the upper electrode film so that a balance between the element stress and the internal stress is secured.

20. A sensor comprising a sensor main body including a concavity, a flexible member mounted to the sensor main body so as to cover the concavity, a thin-film piezoelectric material element which is adhered to the flexible member so as to transform the flexible member;

wherein the thin-film piezoelectric material element comprising:

a lower electrode film;

a piezoelectric material film; and an upper electrode film;

wherein the lower electrode film, the piezoelectric material film and the upper electrode film are laminated sequentially;

wherein the piezoelectric material film has an upper surface of the upper electrode film side, and the upper surface is a concavity and convexity surface having a convex part and a concave part, the convex part is a curved surface convexly projected from a center surface of the concavity and convexity surface along a height direction, and the concave part is a curved surface concavely hollowed from the center surface and connected to the convex part, wherein the upper electrode film is formed on the concavity and convexity surface, the thin-film piezoelectric material element comprising:

a stress balancing film having an internal stress capable of cancelling an element stress which the lower electrode film, the piezoelectric material film and the upper electrode film curve convexly toward a direction from the upper electrode film to the lower electrode film, wherein the stress balancing film is formed on the upper electrode film so that a balance between the element stress and the internal stress is secured.

* * * * *